(12) United States Patent  
Okabe et al.

(10) Patent No.: US 12,161,031 B2  
(45) Date of Patent: Dec. 3, 2024

(54) DISPLAY DEVICE

(71) Applicant: SHARP KABUSHIKI KAISHA, Sakai (JP)

(72) Inventors: Tohru Okabe, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 480 days.

(21) Appl. No.: 17/762,321

(22) PCT Filed: Oct. 21, 2019

(86) PCT No.: PCT/JP2019/041366  
§ 371 (c)(1),  
(2) Date: Mar. 21, 2022

(87) PCT Pub. No.: WO2021/079412  
PCT Pub. Date: Apr. 29, 2021

(65) Prior Publication Data  
US 2022/0415997 A1    Dec. 29, 2022

(51) Int. Cl.  
*H10K 59/131*    (2023.01)  
*H10K 59/124*    (2023.01)

(52) U.S. Cl.  
CPC ......... *H10K 59/131* (2023.02); *H10K 59/124* (2023.02)

(58) Field of Classification Search  
None  
See application file for complete search history.

(56) References Cited

U.S. PATENT DOCUMENTS

| | | | |
|---|---|---|---|
| 10,170,534 B1* | 1/2019 | Kim | ................ H01L 27/124 |
| 10,978,447 B2* | 4/2021 | Kim | ................ G06F 3/0412 |
| 11,316,004 B2* | 4/2022 | Kim | ................ H10K 59/8791 |
| 2011/0199564 A1 | 8/2011 | Moriwaki | |
| 2014/0092354 A1 | 4/2014 | Moriwaki | |
| 2014/0117330 A1 | 5/2014 | Cho et al. | |
| 2015/0340418 A1 | 11/2015 | Moriwaki | |
| 2016/0365398 A1 | 12/2016 | Kim et al. | |
| 2019/0157607 A1 | 5/2019 | Kim et al. | |

(Continued)

FOREIGN PATENT DOCUMENTS

| | | | |
|---|---|---|---|
| JP | 2014086415 A | 5/2014 | |
| WO | 2010/038514 A1 | 4/2010 | |

(Continued)

*Primary Examiner* — Nishath Yasmeen  
(74) *Attorney, Agent, or Firm* — ScienBiziP, P.C.

(57) ABSTRACT

A display device includes a thin film transistor layer including a first interlayer insulation film, a first wiring layer, a second interlayer insulation film, a second wiring layer, a third interlayer insulation film, a third wiring layer, a first planarization film, a fourth wiring layer, and a second planarization film; and a first damming wall in a frame area separated from the first and second planarization film in a display area by a first slit. There is provided a fourth interlayer insulation film between the third and fourth wiring layer. The fourth interlayer insulation film covers an edge of either one or both of a first frame line and a second frame line as the third wiring layer in a region where the first frame line is located opposite the second frame line in a plan view, the edge facing the display area and being exposed in the first slit.

20 Claims, 17 Drawing Sheets

(56) References Cited

U.S. PATENT DOCUMENTS

| | | | |
|---|---|---|---|
| 2019/0348476 A1 | 11/2019 | Kato | |
| 2019/0363284 A1 | 11/2019 | Yasuda et al. | |
| 2020/0043997 A1* | 2/2020 | Sonoda | H10K 59/8722 |
| 2020/0365681 A1 | 11/2020 | Gunji | |
| 2021/0098538 A1 | 4/2021 | Kato | |
| 2021/0271336 A1* | 9/2021 | Yamanaka | H05B 33/04 |
| 2021/0288286 A1* | 9/2021 | Okabe | H10K 59/131 |

FOREIGN PATENT DOCUMENTS

| | | |
|---|---|---|
| WO | 2018/142739 A1 | 8/2018 |
| WO | 2018/179168 A1 | 10/2018 |
| WO | 2019/156024 A1 | 8/2019 |

* cited by examiner

DISPLAY DEVICE

TECHNICAL FIELD

The disclosure relates to display devices.

BACKGROUND ART

The OLED display device, or the self-luminous display device built around OLEDs (organic light-emitting diodes), has been attracting attention as an alternative to the liquid crystal display device. The OLED display device includes, for example: a base substrate; a thin film transistor (may be referred to as a "TFT" in the following description) layer on the base substrate; an OLED layer on the TFT layer; and a sealing film covering the OLED layer. The OLED layer includes, for example, a matrix of OLEDs. The sealing film includes: a first inorganic sealing film covering the OLED layer; an organic sealing film on the first inorganic sealing film; and a second inorganic sealing film, on the first inorganic sealing film, covering the organic sealing film. Each OLED includes: a first electrode on the TFT layer, an organic light-emitting layer on the first electrode; and a second electrode on the organic light-emitting layer.

Patent Literature 1, as an example, discloses a display device including: a stack of alternating inorganic film layers formed by, for example, CVD (chemical vapor deposition) and organic film layers formed by, for example, inkjet technology; and a thin film sealing layer covering organic light-emitting elements.

CITATION LIST

Patent Literature

Patent Literature 1: Japanese Unexamined Patent Application Publication, Tokukai, No. 2014-86415

SUMMARY

Technical Problem

To form an organic sealing film by inkjet technology as in the display device disclosed in Patent Literature 1, a frame-shaped damming wall that dams up the ink that will form the organic sealing film needs to be provided in a frame area that surrounds a display area where there is provided a plurality of OLEDs. There are also provided a first frame line and a second frame line in the frame area of the OLED display device to supply an electric current to the OLEDs. The first frame line is electrically connected to a power supply line that is a part of the TFT layer, to be fed with a high-voltage power supply (ELVDD). The second frame line is electrically connected to a second electrode, to be fed with a low-voltage power supply (ELVSS). These first and second frame lines extend from the periphery of the display area and run next to each other through the damming wall to reach a terminal portion located on an edge of the frame area. If there are provided a planarization film on the first and second frame lines and a first electrode on the planarization film, and the damming wall is made of the same material and in the same layer as the planarization film, a thick resist pattern for patterning a metal film that will form the first electrode is inevitably formed on the bottom portion of the sidewall of the damming wall. This structure will leave an unnecessary, residual metal film between the first frame line and the second frame line, which could undesirably short-circuit the first frame line and the second frame line.

In view of the foregoing problems, it is an object of the disclosure to restrain short-circuiting between frame lines.

Solution to Problem

To achieve this object, the disclosure is directed to a display device including: a base substrate; a thin film transistor layer on the base substrate, the thin film transistor layer including a sequential stack of a semiconductor layer, a first interlayer insulation film, a first wiring layer, a second interlayer insulation film, a second wiring layer, a third interlayer insulation film, a third wiring layer, a first planarization film, a fourth wiring layer, and a second planarization film; a light-emitting element layer on the thin film transistor layer, the light-emitting element layer including a sequential stack of a plurality of first electrodes, a common edge cover, a plurality of light-emitting layers, and a common second electrode in such a manner as to correspond to a plurality of subpixels in a display area; a sealing film covering the light-emitting element layer and including a sequential stack of a first inorganic sealing film, an organic sealing film, and a second inorganic sealing film; a first damming wall in a frame area surrounding the display area, the first damming wall surrounding the display area, overlapping a periphery of the organic sealing film, and being separated from the first planarization film and the second planarization film in the display area by a first slit formed through the first planarization film and the second planarization film; a second damming wall in the frame area, the second damming wall surrounding the first damming wall and being separated from the first damming wall by a second slit formed through the first planarization film and the second planarization film; a power supply line as the fourth wiring layer in the display area, the power supply line being electrically connected to the plurality of first electrodes via a thin film transistor; a first frame line as the third wiring layer in the frame area, the first frame line being electrically connected to the power supply line; a second frame line as the third wiring layer in the frame area, the second frame line being electrically connected to the second electrode; and a first conductive layer in the frame area, the first conductive layer being made of a same material and in a same layer as the plurality of first electrodes, overlapping the second frame line via the first slit, and electrically connecting the second frame line and the second electrode, wherein there is provided a fourth interlayer insulation film between the third wiring layer and the fourth wiring layer, and the fourth interlayer insulation film covers an edge of either one or both of the first frame line and the second frame line in a region where the first frame line is located opposite the second frame line in a plan view, the edge facing the display area and being exposed in the first slit.

Advantageous Effects of Disclosure

According to the disclosure, the fourth interlayer insulation film, provided between the third wiring layer and the fourth wiring layer, covers an edge of either one or both of the first frame line and the second frame line in a region where the first frame line is located opposite the second frame line in a plan view, the edge facing the display area and being exposed in the first slit. This structure restrains short-circuiting between the frame lines.

DESCRIPTION OF EMBODIMENTS

The following will describe embodiments of the disclosure in detail with reference to drawings. The disclosure is not limited by the embodiments.

First Embodiment

Figure 1:
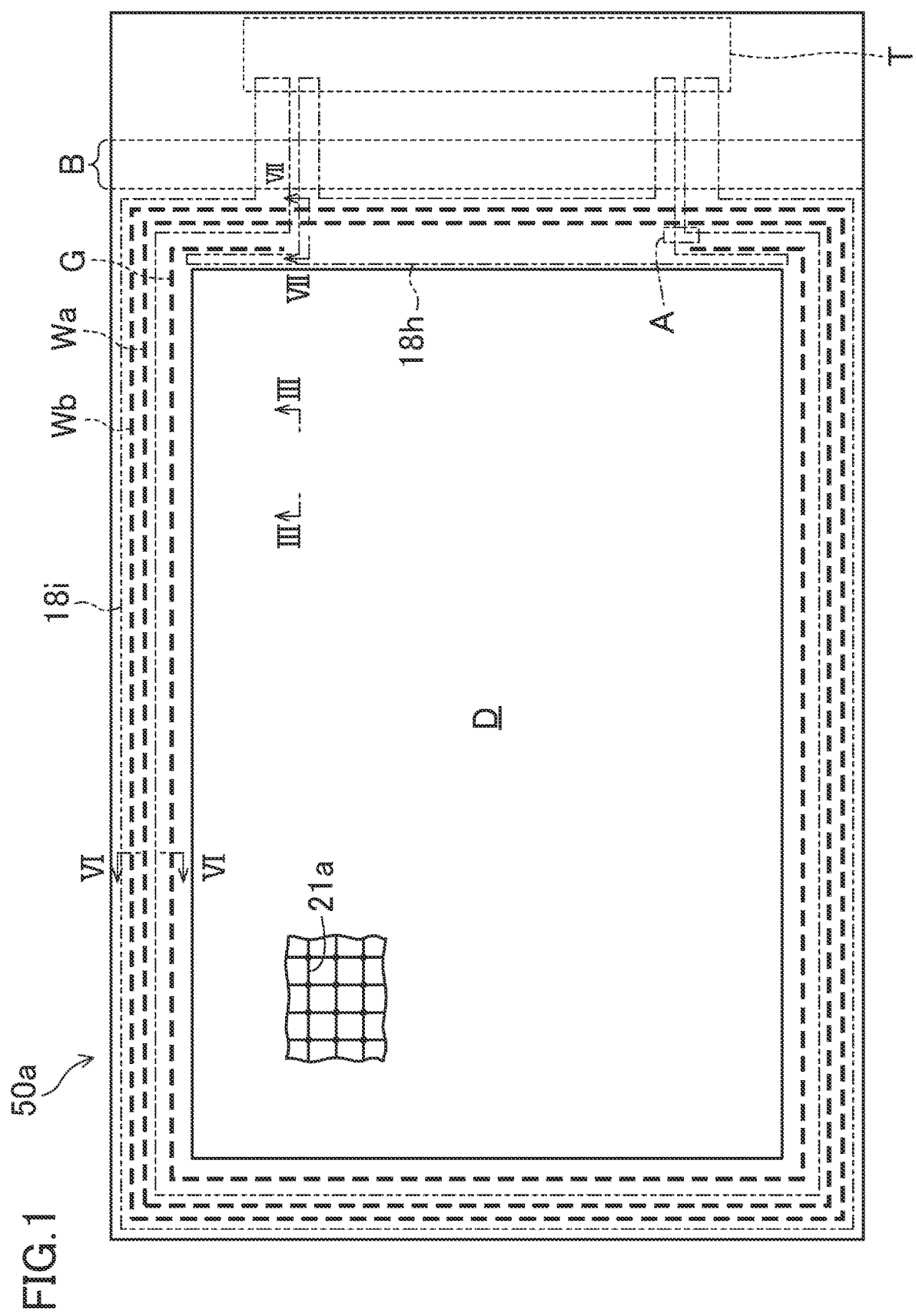
FIG. 1 is a schematic plan view of a structure of an OLED display device in accordance with a first embodiment of the disclosure.
Figure 2:
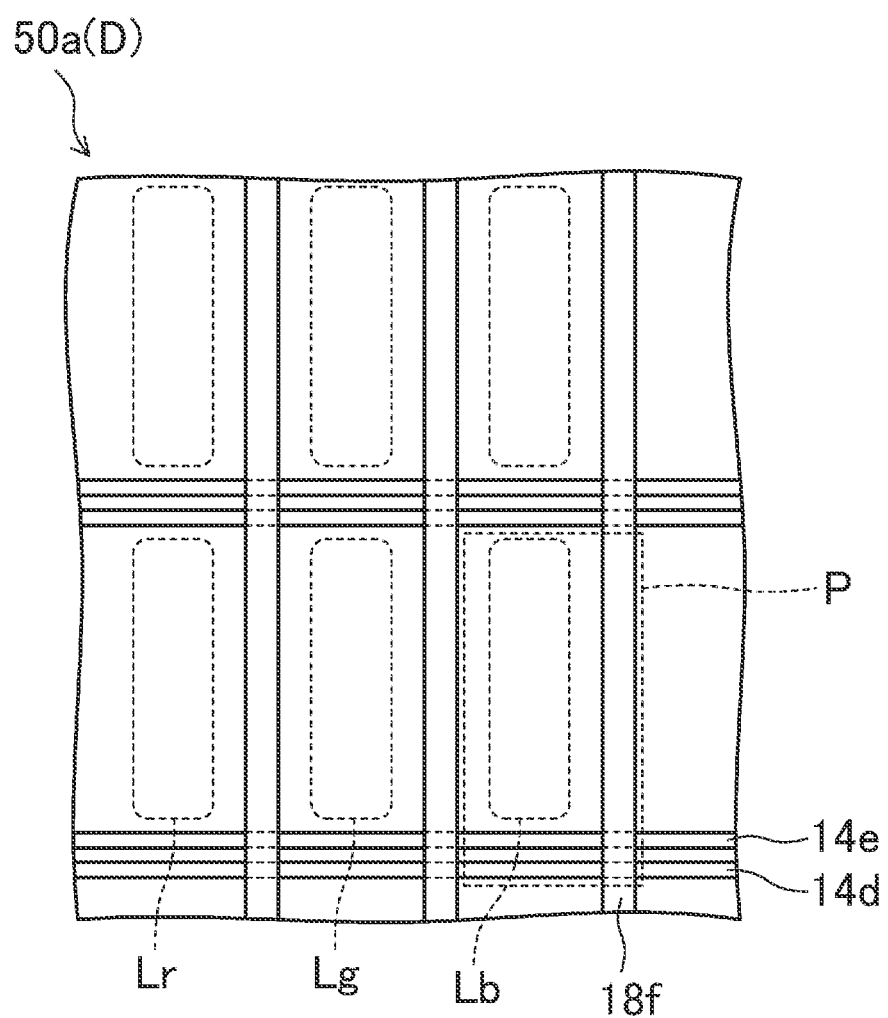
FIG. 2 is a plan view of a display area of the OLED display device in accordance with the first embodiment of the disclosure.
Figure 3:
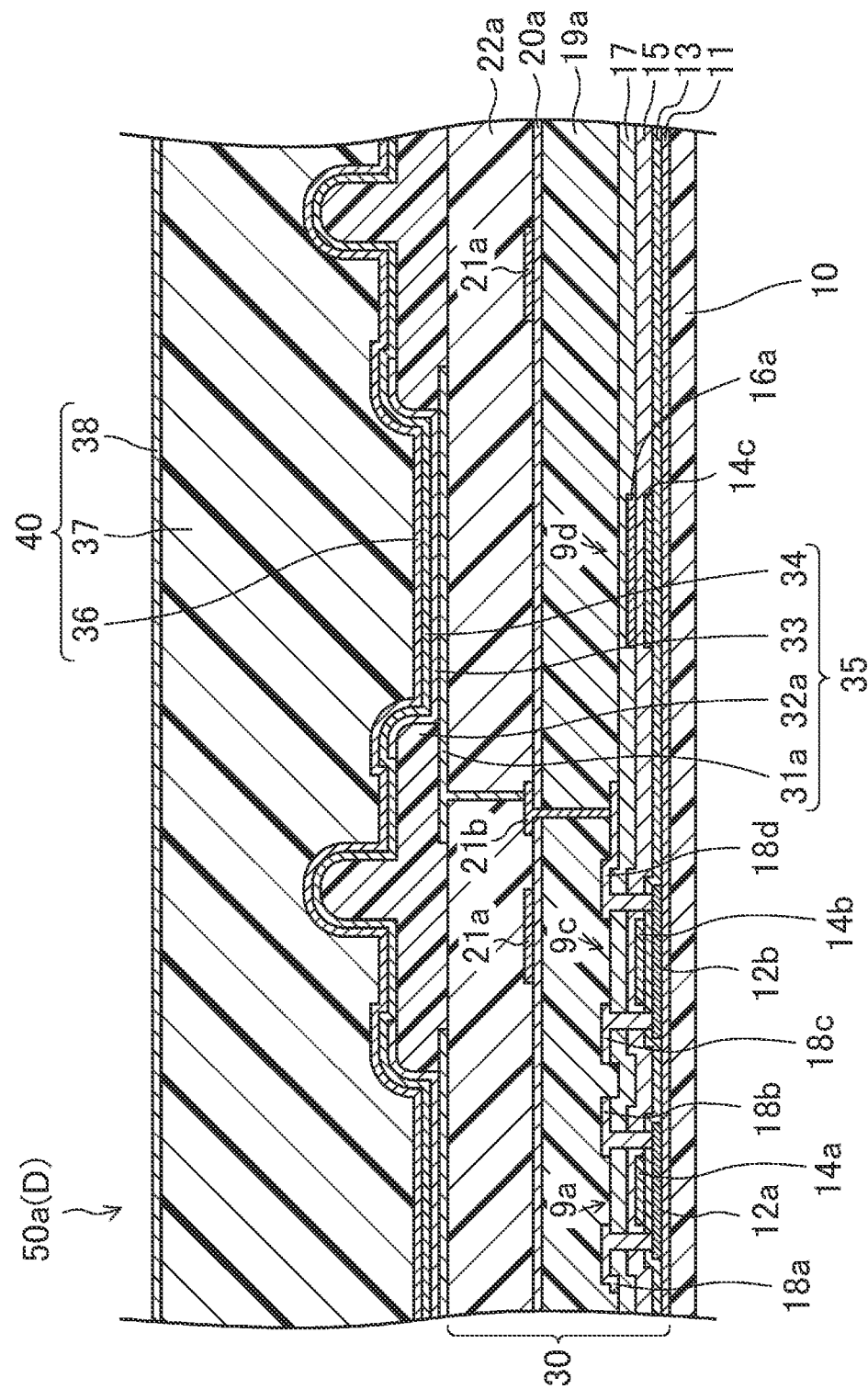
FIG. 3 is a cross-sectional view of the display area of the OLED display device taken along line III-III shown in FIG. 1.
Figure 4:
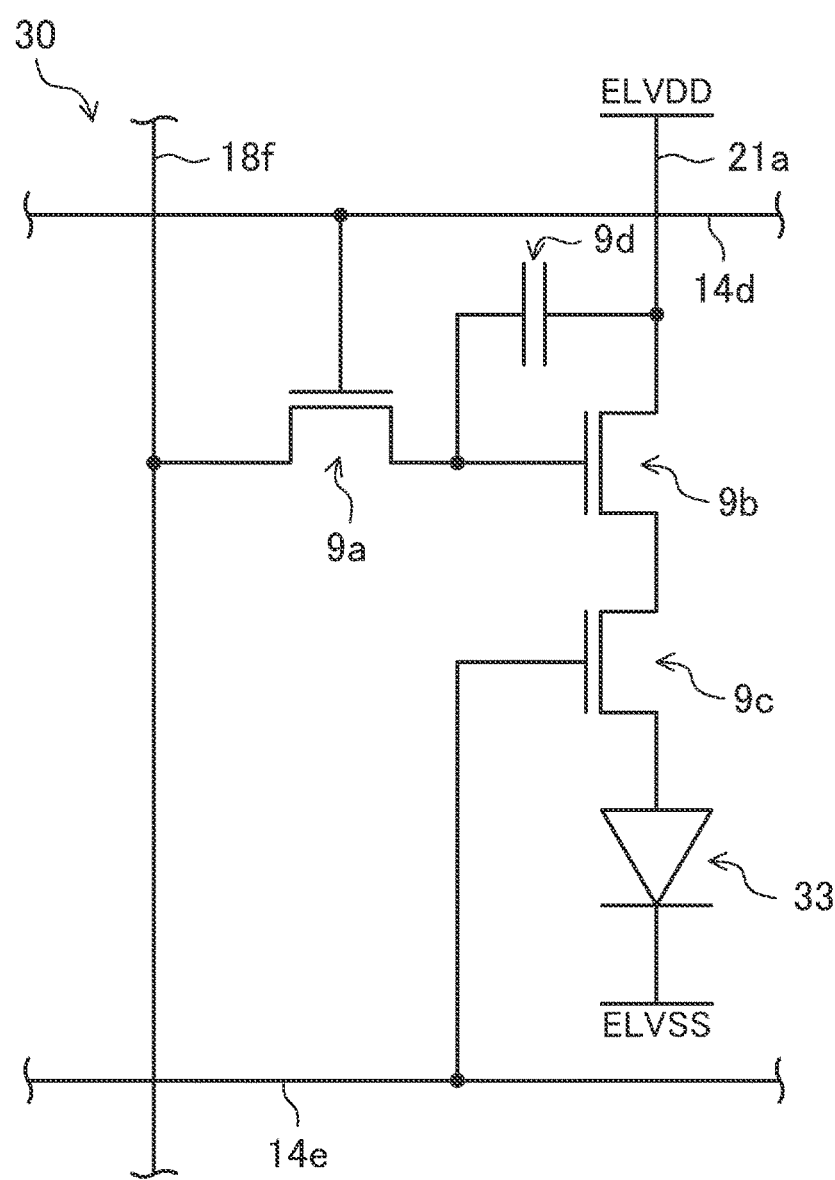
FIG. 4 is an equivalent circuit diagram of a TFT layer that is a part of the OLED display device in accordance with the first embodiment of the disclosure.
Figure 5:
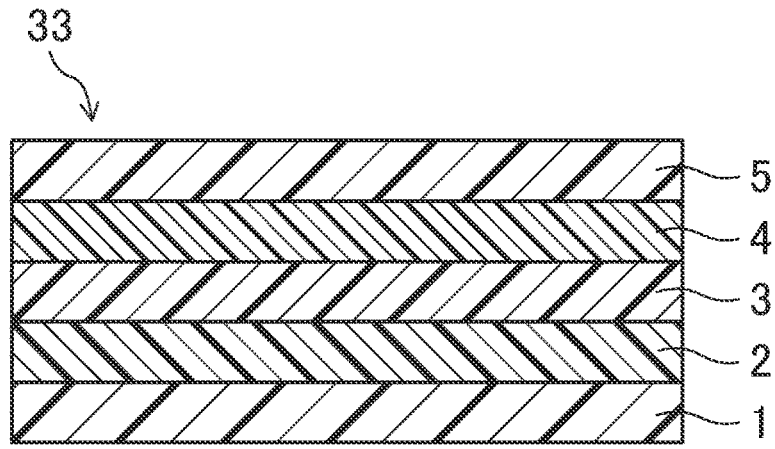
FIG. 5 is a cross-sectional view of an organic light-emitting layer that is a part of the OLED display device in accordance with the first embodiment of the disclosure.
Figure 6:
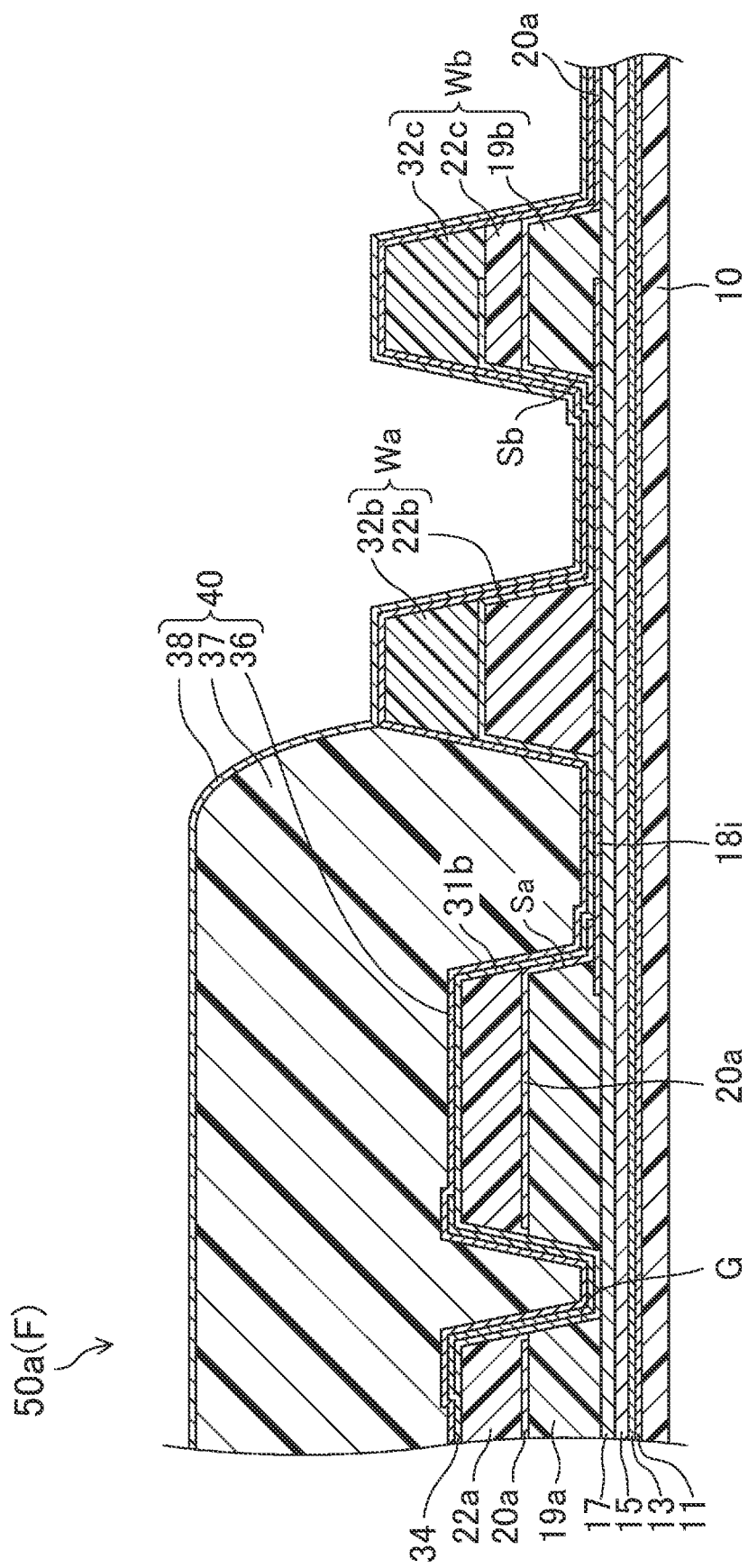
FIG. 6 is a cross-sectional view of a frame area of the OLED display device taken along line VI-VI shown in FIG. 1.
Figure 7:
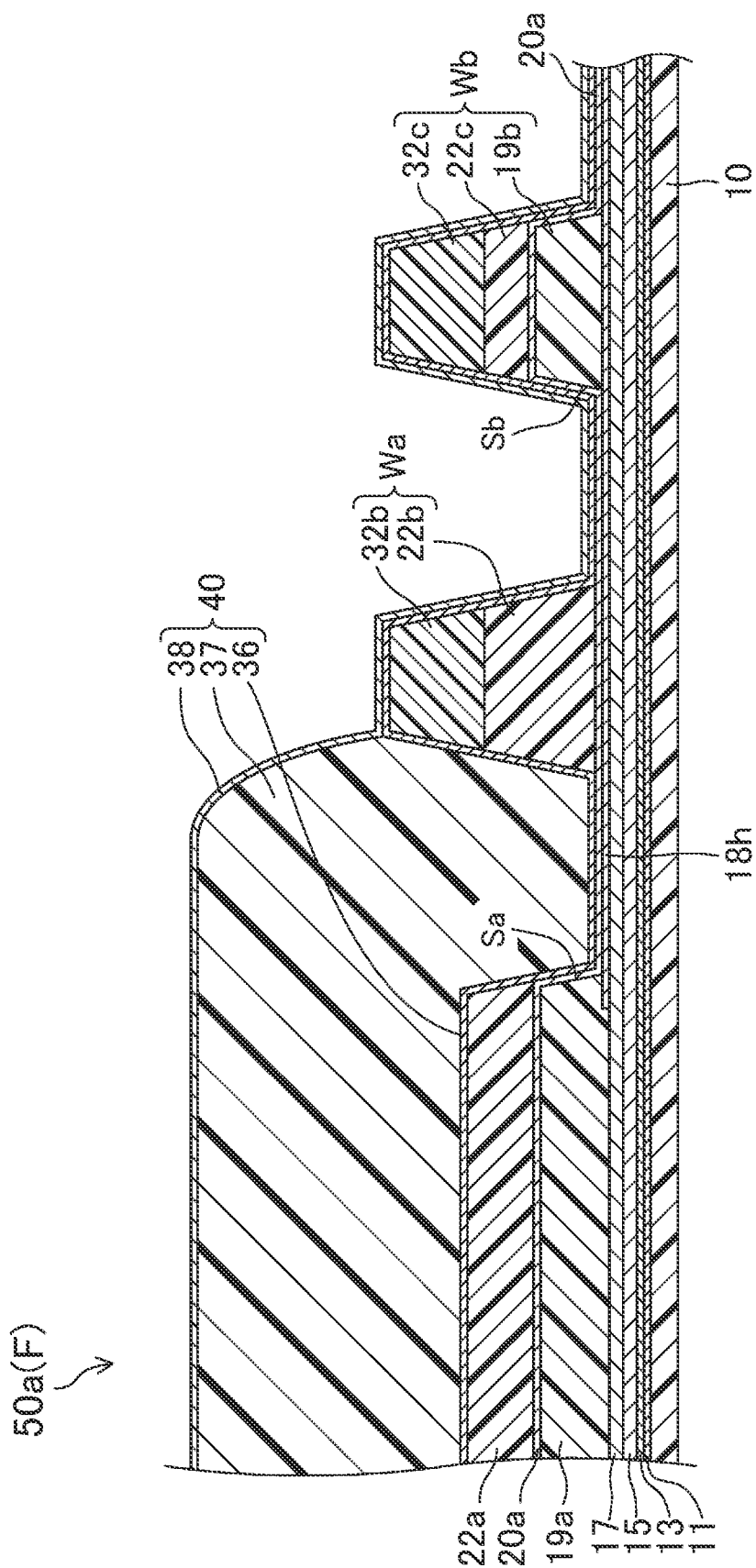
FIG. 7 is a cross-sectional view of the frame area of the OLED display device taken along line VII-VII shown in FIG. 1.
Figure 8:
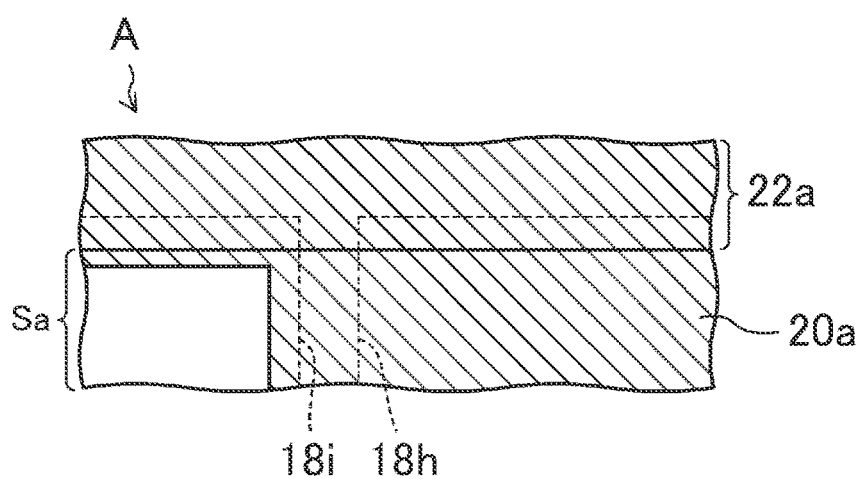
FIG. 8 is an enlarged plan view of region A in FIG. 1.
Figure 13:
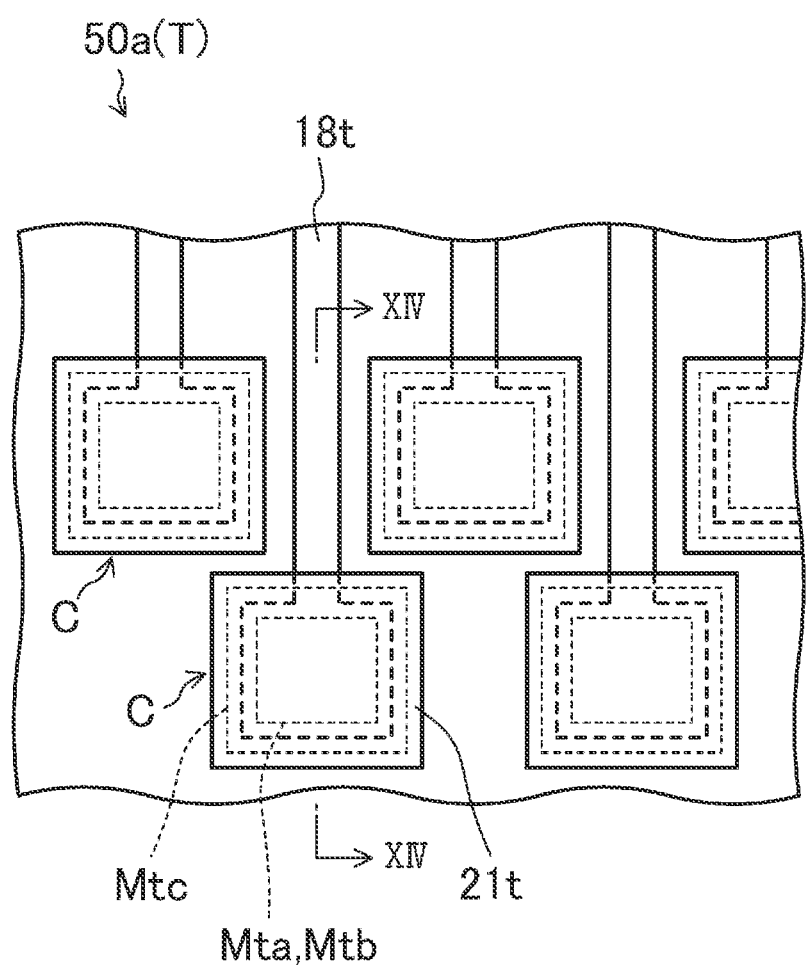
FIG. 13 is a plan view of a terminal portion of the frame area of the OLED display device in accordance with the first embodiment of the disclosure.
Figure 14:
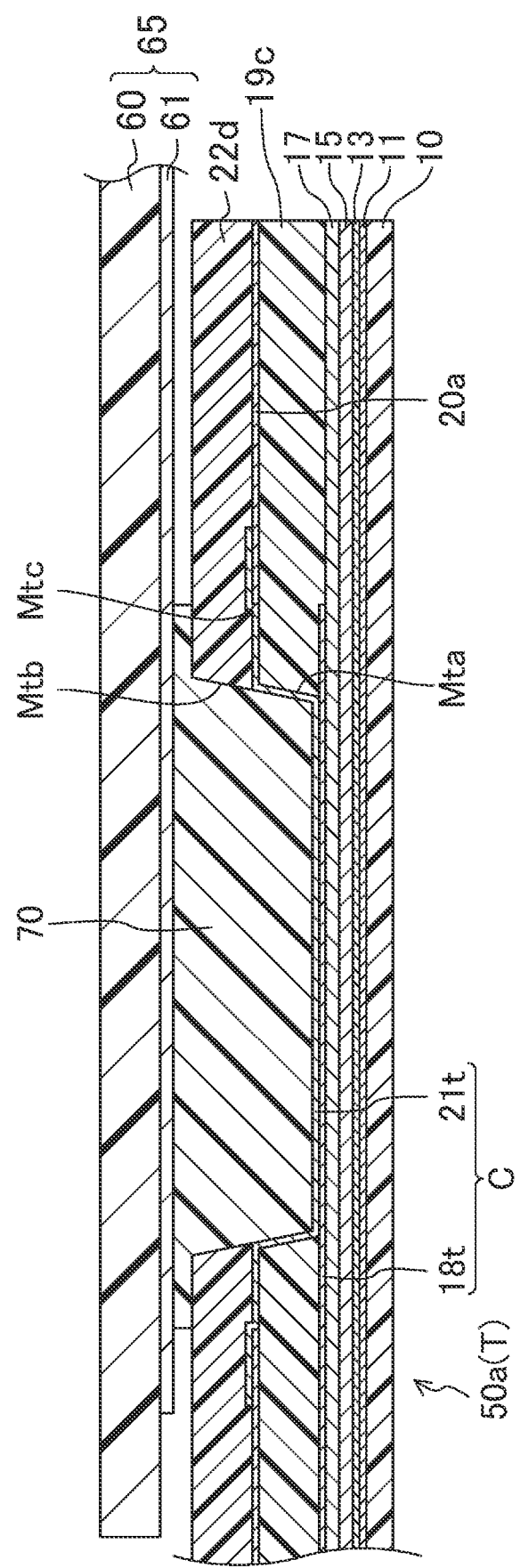
FIG. 14 is a cross-sectional view of the terminal portion of the frame area of the OLED display device taken along line XIV-XIV shown in FIG. 13.

FIGS. 1 to 18 depict a first embodiment of a display device in accordance with the disclosure. The following embodiments will discuss an OLED display device including an OLED layer as an example of a display device including a light-emitting element layer. FIG. 1 is a schematic plan view of a structure of an OLED display device 50a in accordance with the present embodiment. FIG. 2 is a plan view of a display area D of the OLED display device 50a. FIG. 3 is a cross-sectional view of the display area D of the OLED display device 50a taken along line III-III shown in FIG. 1. FIG. 4 is an equivalent circuit diagram of a TFT layer 30 that is a part of the OLED display device 50a. FIG. 5 is a cross-sectional view of an organic light-emitting layer 33 that is a part of the OLED display device 50a. FIGS. 6 and 7 are cross-sectional views of a frame area F of the OLED display device 50a taken respectively along lines VI-VI and VII-VII shown in FIG. 1. FIG. 8 is an enlarged plan view of region A in FIG. 1. FIGS. 9 to 12, corresponding to FIG. 8, are plan views of Variation Examples 1 to 4 of the OLED display device 50a. FIG. 13 is a plan view of a terminal portion T of the frame area F of the OLED display device 50a. FIG. 14 is a cross-sectional view of the terminal portion T of the frame area F of the OLED display device 50a taken along line XIV-XIV shown in FIG. 13.

The OLED display device 50a includes, for example: the rectangular display area D for producing an image display; and the frame area F shaped like a rectangular frame that surrounds the display area D, as shown in FIG. 1. The present embodiment gives the rectangular display area D as an example. This rectangular shape encompasses, for example, generally rectangular shapes such as those with a curved side(s), those with a round corner(s), and those with a notched side(s).

There is provided a matrix of subpixels P in the display area D as shown in FIG. 2. In the display area D are there also provided, for example, those subpixels P each of which includes a red-light-emission region Lr for producing a red display, those subpixels P each of which includes a green-light-emission region Lg for producing a green display, and those subpixels P each of which includes a blue-light-emission region Lb for producing a blue display. Three subpixels, one from each of these three types of subpixels P, are arranged adjacent to each other as shown in FIG. 2. A single pixel is composed of, as an example, three adjacent subpixels P that include the red-light-emission region Lr, the green-light-emission region Lg, and the blue-light-emission region Lb respectively in the display area D.

The terminal portion T, in FIG. 1, resides extending in one direction (vertically in the figure) on the right edge of the frame area F. Still referring to FIG. 1, the frame area F further includes a bending portion B extending in one direction (vertically in the figure) between the display area D and the terminal portion T. The bending portion B can be bent, for example, by 180° along the vertical direction in the figure (to form a "U" shape). In the terminal portion T is there provided a plurality of terminals C (see FIG. 13) in the direction in which the terminal portion T extends as will be detailed later. A trench G runs through a first planarization film 19a and a second planarization film 22a, which will be described later in detail, in the frame area F as shown in FIGS. 1 and 6. The trench G is shaped generally like letter "C" in a plan view so that the trench G has an opening facing the terminal portion T in a plan view as shown in FIG. 1.

The OLED display device 50a, as shown in FIG. 3, includes: a resin substrate layer 10 as a base substrate; the TFT layer 30 on the resin substrate layer 10; an OLED layer 35 as a light-emitting element layer on the TFT layer 30; and a sealing film 40 on the OLED layer 30.

The resin substrate layer 10 is made of, for example, a polyimide resin.

The TFT layer 30 includes: a base coat film 11 on the resin substrate layer 10; and a plurality of first TFTs 9a, a plurality of second TFTs 9b (see FIG. 4), a plurality of third TFTs 9c, and a plurality of capacitors 9d on the base coat film 11, as shown in FIG. 3. The TFT layer 30 includes a sequential stack of the first planarization film 19a, a fourth interlayer insulation film 20a, and the second planarization film 22a on the first TFTs 9a, the second TFTs 9b, the third TFTs 9c, and the capacitors 9d as shown in FIG. 3.

The TFT layer 30 includes semiconductor layers 12a and 12b, a first interlayer insulation film 13, gate electrodes 14a and 14b and a lower conductive layer 14c (first wiring layer), a second interlayer insulation film 15, an upper conductive layer 16a (second wiring layer), a third interlayer insulation film 17, source electrodes 18a and 18c and drain electrodes 18b and 18d (third wiring layer), the first planarization film 19a, the fourth interlayer insulation film 20a, power supply lines 21a and a relay layer 21b (fourth wiring layer), and the second planarization film 22a, all of which are provided on the resin substrate layer 10 in the stated order, as shown in FIG. 3. These first to fourth wiring layers are made of, for example, a monolayer metal film of, for example, molybdenum (Mo), titanium (Ti), aluminum (Al), copper (Cu), or tungsten (W) or a multilayer metal film of, for example, Mo (top layer)/Al (middle layer)/Mo (bottom layer), Ti/Al/Ti, Al (top layer)/Ti (bottom layer), Cu/Mo, or Cu/Ti. The first and second wiring layers are preferably made of the same material, for example, an approximately 200-nm thick molybdenum film. The third and fourth wiring layers are preferably made of the same material, for example, an approximately 600-nm thick metal multilayer film of, for example, Ti/Al/Ti that can be etched with the same etchant or etching gas. The third and fourth wiring layers are thicker than the first and second wiring layers.

The present embodiment describes as an example a layered structure in which the fourth interlayer insulation film 20a resides on the first planarization film 19a. The fourth interlayer insulation film 20a may alternatively be provided between the first planarization film 19a and the source electrodes 18a and 18c and between the first planarization film 19a and the drain electrodes 18b and 18d (third wiring layer). If the fourth interlayer insulation film 20a is disposed on the first planarization film 19a, this structure restrains the surface of the first planarization film 19a from being etched, thereby reducing the contamination of the interior of the chamber, for example, when the fourth wiring layer is subjected to dry etching for patterning. If the fourth interlayer insulation film is disposed between the third wiring layer and the first planarization film 19a, the fourth interlayer insulation film protects the third wiring layer when the fourth wiring layer undergoes patterning.

Referring to FIGS. 2 and 4, the TFT layer 30 includes a plurality of gate lines 14d extending horizontally in the figures and parallel to each other in the display area D. Referring to FIGS. 2 and 4, the TFT layer 30 further includes a plurality of light-emission control lines 14e extending horizontally in the figures and parallel to each other in the display area D. Each light-emission control line 14e is arranged adjacent to an associated one of the gate lines 14d, as shown in FIG. 2. Still referring to FIGS. 2 and 4, the TFT layer 30 further includes a plurality of source lines 18f extending vertically in the figures and parallel to each other in the display area D. The TFT layer 30 further includes the power supply lines 21a in a lattice arrangement the display area D as shown in FIG. 1. Each subpixel P includes one of the first TFTs 9a, one of the second TFTs 9b, one of the third TFTs 9c, and one of the capacitors 9d in the TFT layer 30 as shown in FIG. 4.

The base coat film 11 is made of, for example, a monolayer or multilayer inorganic insulation film of, for example, silicon nitride, silicon oxide, and/or silicon oxynitride.

Each first TFT 9a is electrically connected to the gate line 14d, the source line 18f, and the second TFT 9b of the subpixel P as shown in FIG. 4. The first TFT 9a includes the semiconductor layer 12a, the first interlayer insulation film 13, the gate electrode 14a, the second interlayer insulation film 15, the third interlayer insulation film 17, the source electrode 18a, and the drain electrode 18b, all of which are provided on the base coat film 11 in the stated order, as shown in FIG. 3. The semiconductor layer 12a is provided in an insular manner on the base coat film 11 as shown in FIG. 3 and has a channel region, a source region, and a drain region as will be described later in detail. The semiconductor layer 12a and the semiconductor layer 12b (detailed later) are made of, for example, a low-temperature polysilicon film or an In—Ga—Zn—O-based oxide semiconductor film. The first interlayer insulation film 13 is provided as a gate insulation film covering the semiconductor layer 12a as shown in FIG. 3. The gate electrode 14a is provided on the first interlayer insulation film 13, overlapping the channel region of the semiconductor layer 12a as shown in FIG. 3. The second interlayer insulation film 15 and the third interlayer insulation film 17 are provided in the stated order, covering the gate electrode 14a as shown in FIG. 3. The source electrode 18a and the drain electrode 18b are provided on the third interlayer insulation film 17 so as to be separated by a distance from each other as shown in FIG. 3. The source electrode 18a and the drain electrode 18b are electrically connected respectively to the source region and the drain region of the semiconductor layer 12a via contact holes formed through a multilayer film of a gate insulation film 13, the second interlayer insulation film 15, and the third interlayer insulation film 17 as shown in FIG. 3. The first interlayer insulation film 13, the second interlayer insulation film 15, the third interlayer insulation film 17, and the fourth interlayer insulation film 20a (detailed later) are each made of, for example, a monolayer or multilayer inorganic insulation film of, for example, silicon nitride, silicon oxide, and/or silicon oxynitride.

Each second TFT 9b is electrically connected to the first TFT 9a, the power supply line 21a, and the third TFT 9c of the subpixel P as shown in FIG. 4. The second TFT 9b has substantially the same structure as the first TFT 9a and the third TFT 9c (detailed later).

Each third TFT 9c is electrically connected to the second TFT 9b, the power supply line 21a, and the light-emission control line 14e of the subpixel P as shown in FIG. 4. The third TFT 9c includes the semiconductor layer 12b, the first interlayer insulation film 13, the gate electrode 14b, the second interlayer insulation film 15, the third interlayer insulation film 17, the source electrode 18c, and the drain electrode 18d, all of which are provided on the base coat film 11 in the stated order, as shown in FIG. 3. The semiconductor layer 12b is provided in an insular manner on the base coat film 11 as shown in FIG. 3 and has a channel region, a source region, and a drain region similarly to the semiconductor layer 12a. The first interlayer insulation film 13 is provided as a gate insulation film covering the semiconductor layer 12b as shown in FIG. 3. The gate electrode 14b is provided on the first interlayer insulation film 13, overlapping the channel region of the semiconductor layer 12b as shown in FIG. 3. The second interlayer insulation film 15 and the third interlayer insulation film 17 are provided in the stated order, covering the gate electrode 14b as shown in FIG. 3. The source electrode 18c and the drain electrode 18d are provided on the third interlayer insulation film 17 so as to be separated by a distance from each other as shown in FIG. 3. The source electrode 18c and the drain electrode 18d are electrically connected respectively to the source region and the drain region of the semiconductor layer 12b via contact holes formed through a multilayer film of the first interlayer insulation film 13, the second interlayer insulation film 15, and the third interlayer insulation film 17 as shown in FIG. 3.

The first TFT 9a, the second TFT 9b, and the third TFT 9c are top-gate TFTs as an example in the present embodiment, but may alternatively be bottom-gate TFTs.

Each capacitor 9d is electrically connected to the first TFT 9a and the power supply line 21a of the subpixel P as shown in FIG. 4. The capacitor 9d includes: the lower conductive layer 14c made of the same material and in the same layer as, for example, the gate electrode 14a; the second interlayer insulation film 15 provided covering the lower conductive layer 14c; and the upper conductive layer 16a provided on the second interlayer insulation film 15, overlapping the lower conductive layer 14c, as shown in FIG. 3. The upper conductive layer 16a is electrically connected to the power supply line 21a via a contact hole (not shown) formed through the third interlayer insulation film 17, the first planarization film 19a, and the fourth interlayer insulation film 20a.

The first planarization film 19a, the second planarization film 22a, and an edge cover 32a (detailed later) are made of, for example, an organic resin material such as a polyimide resin or an acrylic resin.

The OLED layer 35 includes a matrix of OLEDs. As shown in FIG. 3, the OLED layer 35 includes a plurality of first electrodes 31a, the edge cover 32a, the organic light-emitting layers 33, and a second electrode 34, all of which are provided on the TFT layer 30 in the stated order.

The first electrodes 31a are associated with the respective subpixels P and arranged in a matrix on the second planarization film 22a as shown in FIG. 3. Each first electrode 31a is electrically connected to the drain electrode 18d of an associated one of the third TFTs 9c via a contact hole formed through the first planarization film 19a and the fourth interlayer insulation film 20a, the relay layer 21b, and a contact hole formed through the second planarization film 22a as shown in FIG. 3. The first electrode 31a has a function of injecting holes to the organic light-emitting layer 33. The first electrode 31a is preferably formed of a material that has a large work function in order to improve the efficiency of hole injection to the organic light-emitting layer 33. The first electrode 31a is made of, for example, a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). The first electrode 31a may alternatively made of, for example, an alloy such as astatine-astatine oxide (At—AtO$_2$). As another alternative, the first electrode 31a may be made of, for example, an electrically conductive oxide such as tin oxide (SnO), zinc oxide (ZnO), indium tin oxide (ITO), or indium zinc oxide (IZO). As a further alternative, the first electrode 31a may be a stack of layers of any of these materials. Examples of compound materials that have a large work function include indium tin oxide (ITO) and indium zinc oxide (IZO).

The edge cover 32a is arranged to form a lattice covering the peripheries of the first electrodes 31a across the subpixels P as shown in FIG. 3.

The organic light-emitting layers 33, one for each subpixel P, are arranged in a matrix on the first electrodes 31a as shown in FIG. 3. Each organic light-emitting layer 33 includes a hole injection layer 1, a hole transport layer 2, a light-emitting layer 3, an electron transport layer 4, and an electron injection layer 5, all of which are provided on the first electrode 31a in the stated order as shown in FIG. 5.

The hole injection layer 1, alternatively referred to as the anode buffer layer, has a function of bringing the energy levels of the first electrode 31a and the organic light-emitting layer 33 closer to each other to improve the efficiency of hole injection from the first electrode 31a to the organic light-emitting layer 33. The hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styryl anthracene derivative, a fluorenone derivative, a hydrazone derivative, or a stilbene derivative.

The hole transport layer 2 has a function of improving the efficiency of hole transport from the first electrode 31a to the organic light-emitting layer 33. The hole transport layer 2 is made of, for example, a porphyrin derivative, an aromatic tertiary amine compound, a styryl amine derivative, polyvinyl carbazole, poly-p-phenylene vinylene, polysilane, a triazole derivative, an oxadiazole derivative, an imidazole derivative, a polyaryl alkane derivative, a pyrazoline derivative, a pyrazolone derivative, a phenylenediamine derivative, an aryl amine derivative, an amine-substituted chalcone derivative, an oxazole derivative, a styryl anthracene derivative, a fluorenone derivative, a hydrazone derivative, a stilbene derivative, hydrogenated amorphous silicon, hydrogenated amorphous silicon carbide, zinc sulfide, or zinc selenide.

The light-emitting layer 3 is injected with holes and electrons from the first electrode 31a and the second electrode 34 respectively when the light-emitting layer 3 is under voltage applied by the first electrode 31a and the second electrode 34. These injected holes and electrons recombine in the light-emitting layer 3. The light-emitting layer 3 is made of a material that has a high luminous efficiency. The light-emitting layer 3 is made of, for example, a metal oxinoid compound (8-hydroxy quinoline metal complex), a naphthalene derivative, an anthracene derivative, a diphenyl ethylene derivative, a vinyl acetone derivative, a triphenyl amine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styryl amine derivative, a bis(styryl)benzene derivative, a tris(styryl)benzene derivative, a perylene derivative, a perynone derivative, an amino pyrene derivative, a pyridine derivative, a rhodamine derivative, an acridine derivative, phenoxazone, a quinacridone derivative, rubrene, poly-p-phenylene vinylene, or polysilane.

The electron transport layer 4 has a function of efficiently transporting electrons to the light-emitting layer 3. The electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has a function of bringing the energy levels of the second electrode 34 and the organic light-emitting layer 33 closer to each other to improve the efficiency of electron injection from the second electrode 34 to the organic light-emitting layer 33. This function can lower the drive voltage of the OLED in the OLED layer 35. The electron injection layer 5, alternatively referred to as the cathode buffer layer, is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 34 is provided covering the organic light-emitting layers 33 and the edge cover 32a across the subpixels P as shown in FIG. 3. The second electrode 34 has a function of injecting electrons to the organic light-emitting layer 33. The second electrode 34 is more preferably made of a material that has a small work function in order to improve the efficiency of electron injection to the organic light-emitting layer 33. The second electrode 34 is made of, for example, silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), or lithium fluoride (LiF). The second electrode 34 may alternatively be made of, for example, a magnesium-copper (Mg—Cu) alloy, a magnesium-silver (Mg—Ag) alloy, a sodium-potassium (Na—K) alloy, an astatine-astatine oxide (At—$AtO_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the second electrode 34 may be made of, for example, an electrically conductive oxide such as tin oxide (SnO), zinc oxide (ZnO), indium tin oxide (ITO), or indium zinc oxide (IZO). As a further alternative, the second electrode 34 may be a stack of layers of any of these materials. Examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), and lithium fluoride-calcium-aluminum (LiF—Ca—Al).

The sealing film 40 includes: a first inorganic sealing film 36, an organic sealing film 37, and a second inorganic sealing film 38, all of which are provided on the second electrode 34 in the stated order, covering the second electrode 34 as shown in FIG. 3. The sealing film 40 has a function of protecting the organic light-emitting layer 33 in the OLED layer 35 from, for example, water and oxygen. The first inorganic sealing film 36 and the second inorganic sealing film 38 are made of, for example, an inorganic insulation film such as a silicon nitride film, a silicon oxide film, or a silicon oxynitride film. The organic sealing film 37 is made of, for example, an organic resin material such as an acrylic resin, an epoxy resin, a silicone resin, a polyurea resin, a parylene resin, a polyimide resin, or a polyamide resin.

The OLED display device 50a includes a first damming wall Wa and a second damming wall Wb in the frame area F as shown in FIG. 1. The first damming wall Wa is provided like a frame outside the trench G. The second damming wall Wb is provided like a frame around the first damming wall Wa.

The first damming wall Wa includes: a lower resin layer 22b made of the same material and in the same layer as the second planarization film 22a; and an upper resin layer 32b made of the same material and in the same layer as the edge cover 32a, as shown in FIGS. 6 and 7. The first damming wall Wa is separated by a first slit Sa from the first planarization film 19a and the second planarization film 22a in the display area D as shown in FIGS. 6 and 7. The first slit Sa is shaped like a frame and formed through the first planarization film 19a and the second planarization film 22a. The first damming wall Wa is provided overlapping the periphery of the organic sealing film 37 in the sealing film 40 and structured to restrain ink that will form the organic sealing film 37 in the sealing film 40 from spreading.

The second damming wall Wb includes: a lower resin layer 19b made of the same material and in the same layer as the first planarization film 19a; a middle layer resin layer 22c made of the same material and in the same layer as the second planarization film 22a; and an upper resin layer 32c made of the same material and in the same layer as the edge cover 32a, as shown in FIGS. 6 and 7. The second damming wall Wb is separated by a second slit Sb from the first damming wall Wa as shown in FIGS. 6 and 7. The second slit Sb is shaped like a frame and formed through the first planarization film 19a (lower resin layer 19b) and the second planarization film 22a (middle layer resin layer 22c).

The OLED display device 50a includes a first frame line 18h serving as the third wiring layer described above in the frame area F as shown in FIG. 1. The first frame line 18h is broad where the trench G is open. The edge of the first frame line 18h that faces the display area D linearly extends internal to the trench and both ends of the edge of first frame line 18h that is opposite the display area D extends toward the terminal portion T. The first frame line 18h is electrically connected to the power supply lines 21a in a part of the frame area F that faces the display area D and fed with a high-voltage power supply (ELVDD) through the terminal portion T.

The OLED display device 50a includes a second frame line 18i in the frame area F as shown in FIG. 1. The second frame line 18i is provided generally like letter C as the third wiring layer described above outside the trench G and has both ends thereof extending toward the terminal portion T. The second frame line 18i is electrically connected to the second electrode 34 via a first conductive layer 31b formed in the trench G and fed with a low-voltage power supply (ELVSS) through the terminal portion T as shown in FIG. 6. The first conductive layer 31b is made of the same material and in the same layer as the first electrodes 31a and provided overlapping the second frame line 18i via the first slit Sa in the frame area F and electrically connecting the second frame line 18i and the second electrode 34, as shown in FIG. 6.

The fourth interlayer insulation film 20a (hatched in the figure) is provided covering the first frame line 18h and an edge, of the second frame line 18i, that is exposed in the first slit Sa in a region where the first frame line 18h is located opposite the second frame line 18*i* in a plan view (region A in FIG. 1) as shown in FIG. 8.

The present embodiment describes as an example the fourth interlayer insulation film 20*a* covering the entire first frame line 18*h* and an edge, of the second frame line 18*i*, that is exposed in the first slit Sa. Alternatively, the fourth interlayer insulation film 20*a* may be, for example, any one of fourth interlayer insulation films 20*aa* (Variation Example 1), 20*ab* (Variation Example 2), 20*ac* (Variation Example 3), and 20*ad* (Variation Example 4) below. In other words, the fourth interlayer insulation film 20*a* is capable of restraining short-circuiting between the first frame line 18*h* and the second frame line 18*i* as long as the fourth interlayer insulation film 20*a* is provided covering an edge of either one or both of the first frame line 18*h* and the second frame line 18*i* in a region where the first frame line 18*h* is located opposite the second frame line 18*i* in a plan view, the edge facing the display area D and being exposed in the first slit Sa.

Variation Example 1

Figure 9:
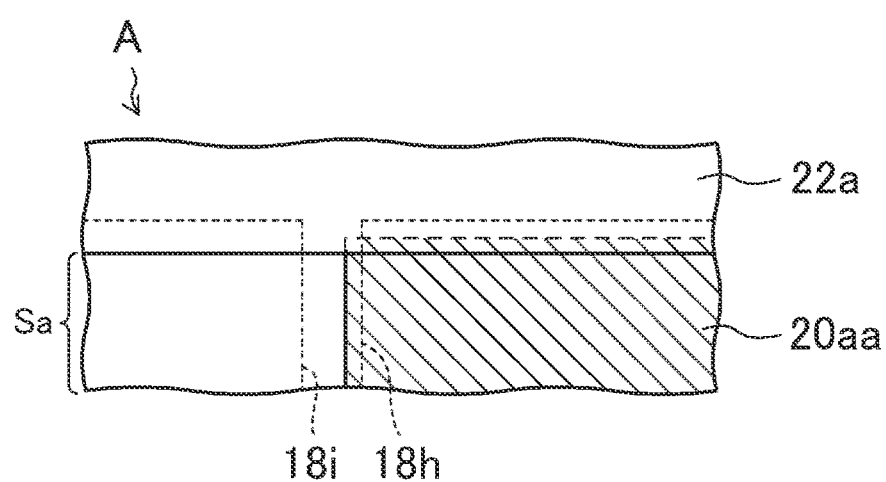
FIG. 9, corresponding to FIG. 8, is a plan view of Variation Example 1 of the OLED display device in accordance with the first embodiment of the disclosure.

The fourth interlayer insulation film 20*aa* is provided covering the entire first frame line 18*h* exposed in the first slit Sa in a region where the first frame line 18*h* is located opposite the second frame line 18*i* in a plan view as shown in FIG. 9.

Variation Example 2

Figure 10:
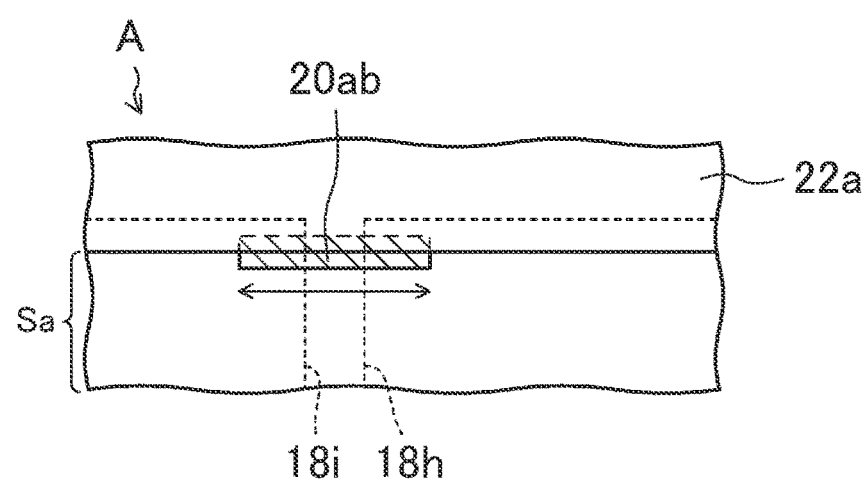
FIG. 10, corresponding to FIG. 8, is a plan view of Variation Example 2 of the OLED display device in accordance with the first embodiment of the disclosure.

The fourth interlayer insulation film 20*ab* is provided covering the edges of the first frame line 18*h* and the second frame line 18*i* in a region where the first frame line 18*h* is located opposite the second frame line 18*i* in a plan view, the edge facing the display area D and being exposed in the first slit Sa, as shown in FIG. 10. The fourth interlayer insulation film 20*ab* leaves an extra distance between the first frame line 18*h* and the second frame line 18*i* (indicated by a double-headed arrow in the figure) on the bottom portion of the sidewall of the first slit Sa as shown in FIG. 10, thereby restraining short-circuiting between the first frame line 18*h* and the second frame line 18*i*.

Variation Example 3

Figure 11:
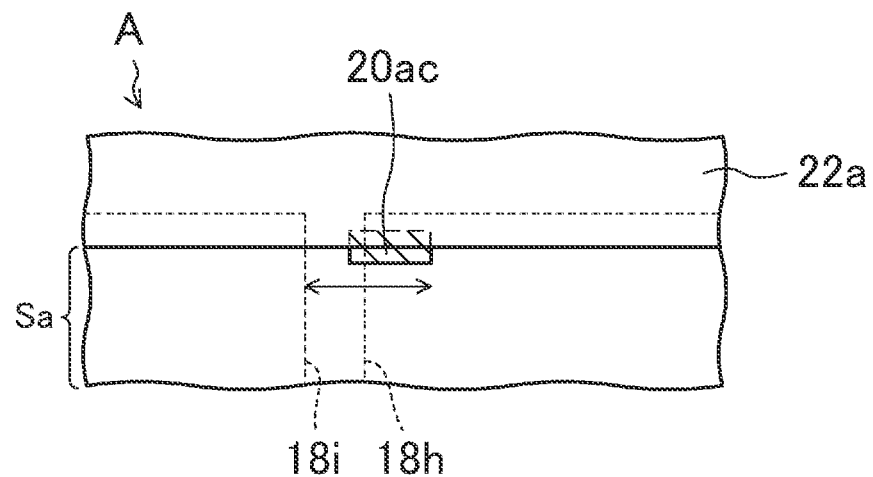
FIG. 11, corresponding to FIG. 8, is a plan view of Variation Example 3 of the OLED display device in accordance with the first embodiment of the disclosur.

The fourth interlayer insulation film 20*ac* is provided covering an edge of the first frame line 18*h* in a region where the first frame line 18*h* is located opposite the second frame line 18*i* in a plan view, the edge facing the display area D and being exposed in the first slit Sa, as shown in FIG. 11. The fourth interlayer insulation film 20*ac* leaves an extra distance between the first frame line 18*h* and the second frame line 18*i* (indicated by a double-headed arrow in the figure) on the bottom portion of the sidewall of the first slit Sa as shown in FIG. 11, thereby restraining short-circuiting between the first frame line 18*h* and the second frame line 18*i*.

Variation Example 4

Figure 12:
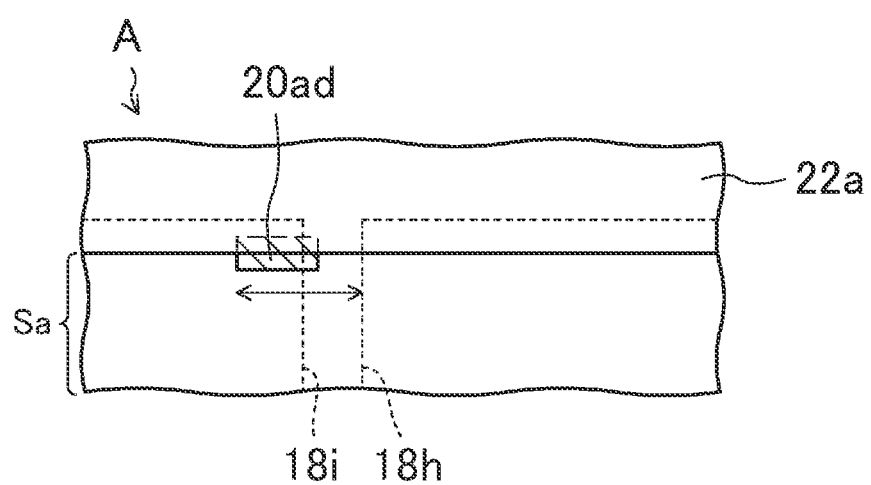
FIG. 12, corresponding to FIG. 8, is a plan view of Variation Example 4 of the OLED display device in accordance with the first embodiment of the disclosure.

The fourth interlayer insulation film 20*ad* is provided covering an edge of the second frame line 18*i* in a region where the first frame line 18*h* is located opposite the second frame line 18*i* in a plan view, the edge facing the display area D and being exposed in the first slit Sa, as shown in FIG. 12. The fourth interlayer insulation film 20*ad* leaves an extra distance between the first frame line 18*h* and the second frame line 18*i* (indicated by a double-headed arrow in the figure) on the bottom portion of the sidewall of the first slit Sa as shown in FIG. 12, thereby restraining short-circuiting between the first frame line 18*h* and the second frame line 18*i*.

Variation Examples 1 to 4 are capable of efficient degassing in the fabrication of the first planarization film 19*a* without the fourth interlayer insulation films 20*aa*, 20*ab*, 20*ac*, and 20*ad* having to cover the first planarization film 19*a* which is a bottom layer of the second planarization film 22*a*.

The present embodiment and Variation Examples 1 to 4 above describe as an example the fourth interlayer insulation film 20*a* covering an edge, of either one or both of the first frame line 18*h* and the second frame line 18*i*, that faces the display area D and that is exposed in the first slit Sa. Alternatively, the fourth interlayer insulation film 20*a* may be provided covering the entire first frame line 18*h* exposed in the second slit Sb or covering an edge, of the second frame line 18*i*, that is opposite the display area D and that is exposed in the second slit Sb. In other words, the fourth interlayer insulation film 20*a* may be provided covering not only an edge, of either one or both of the first frame line 18*h* and the second frame line 18*i*, that faces the display area D and that is exposed in the first slit Sa, but also an edge, of either one or both of the first frame line 18*h* and the second frame line 18*i*, that is opposite the display area D and that is exposed in the second slit Sb. The first slit Sa and the second slit Sb may be provided in the multilayer film of the first planarization film 19*a* and the second planarization film 22*a* or in the second planarization film 22*a* covering the first planarization film 19*a*. The first slit Sa and the second slit Sb are provided in a planarization film that is a part of the second planarization film 22*a* covering the first planarization film 19*a* and that exposes an edge of the second frame line 18*i* and the first frame line 18*h*.

The OLED display device 50*a* includes, in the terminal portion T of the frame area F, the terminals C in two rows in a direction in which the terminal portion T extends as shown in FIG. 13.

Each terminal C includes a first terminal electrode 18*t* and a second terminal electrode 21*t* as shown in FIGS. 13 and 14. The first terminal electrode 18*t* is electrically connected to, for example, the-gate line 14*d*, the light-emission control line 14*e*, the source line 18*f*, the first frame line 18*h*, and the second frame line 18*i*, all of which are provided as the third wiring layer. The second terminal electrode 21*t* is electrically connected to the first terminal electrode 18*t* provided as the fourth wiring layer.

A first planarization film 19*c* provided on the first terminal electrode 18*t* has a first terminal opening Mta to expose a contact portion of the first terminal electrode 18*t* as shown in FIGS. 13 and 14. The first planarization film 19*c* is made of the same material and in the same layer as the first planarization film 19*a* in the display area D.

A second planarization film 22*d* provided on the second terminal electrode 21*t* has a second terminal opening Mtb to expose a contact portion of a first terminal electrode 21*t* as shown in FIGS. 13 and 14. The second planarization film 22*d* is made of the same material and in the same layer as the second planarization film 22*a* in the display area D.

The fourth interlayer insulation film 20*a*, provided between the first planarization film 19*c* and the second planarization film 22*d*, has a third terminal opening Mtc overlapping the second terminal electrode 21*t* as shown in FIGS. 13 and 14. The third terminal opening Mtc has a periphery thereof outside the periphery of the first terminal opening Mta and the periphery of the second terminal opening Mtb as shown in FIGS. 13 and 14.

The second terminal electrode 21*t* is in contact with the first terminal electrode 18*t* via the first terminal opening Mta and electrically connected to an opposite electrode 61 on a flexible printed board (flexible printed circuits; may be referred to as "FPC") 65 via an anisotropic conductive film (may be referred to as "ACF") 70, as shown in FIG. 14. The FPC 65 includes a flexible circuit board main body 60 and the opposite electrode 61 provided on the surface of the FPC main body 60, as shown in FIG. 14.

Figure 15:
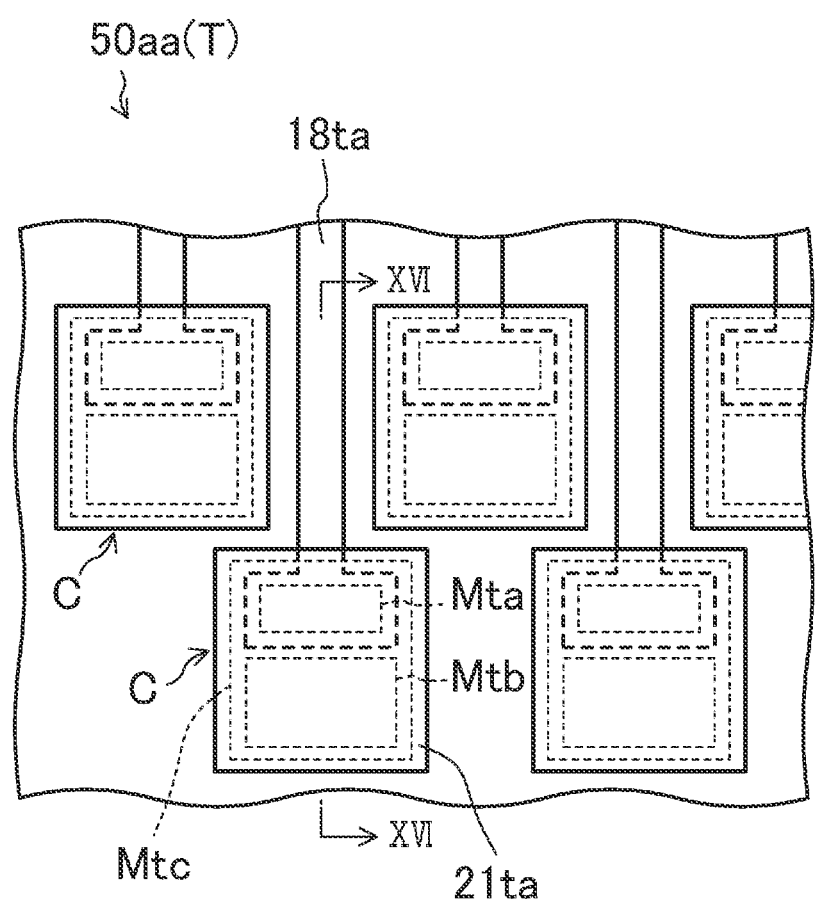
FIG. 15 is a plan view of a terminal portion of a frame area of Variation Example 5 of the OLED display device in accordance with the first embodiment of the disclosure.
Figure 16:
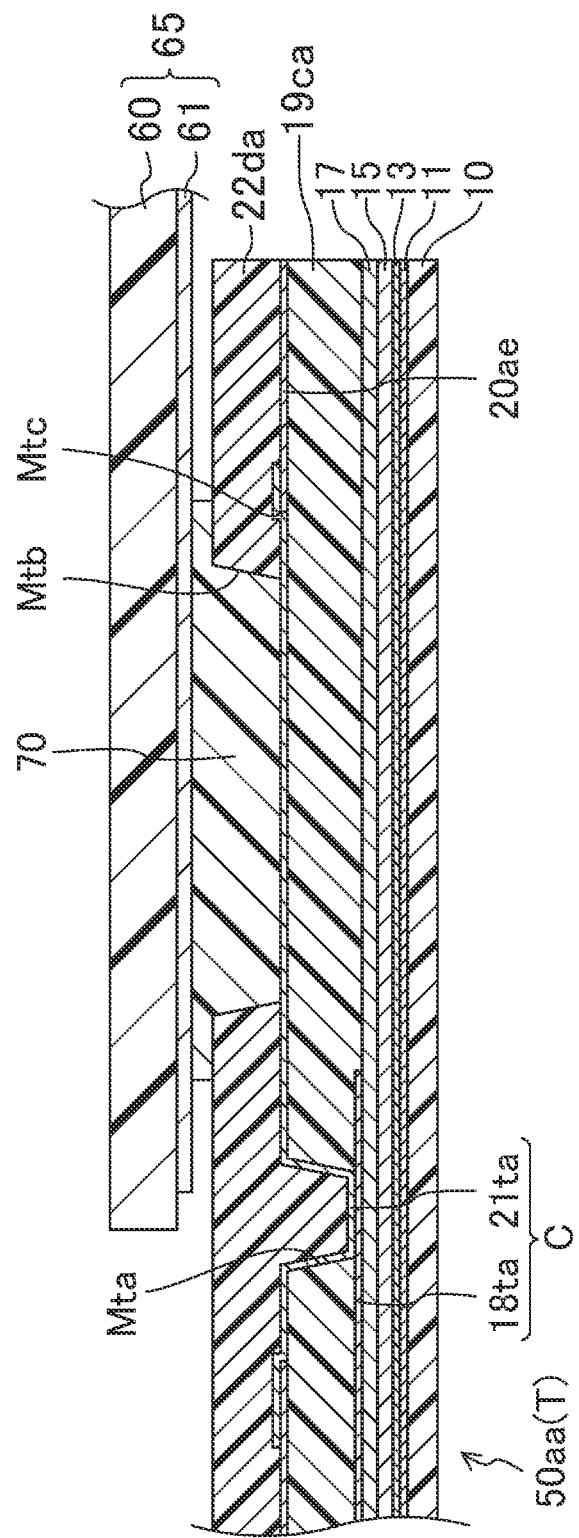
FIG. 16 is a cross-sectional view of the terminal portion of the frame area of Variation Example 5 of the OLED display device taken along line XVI-XVI shown in FIG. 15.
Figure 17:
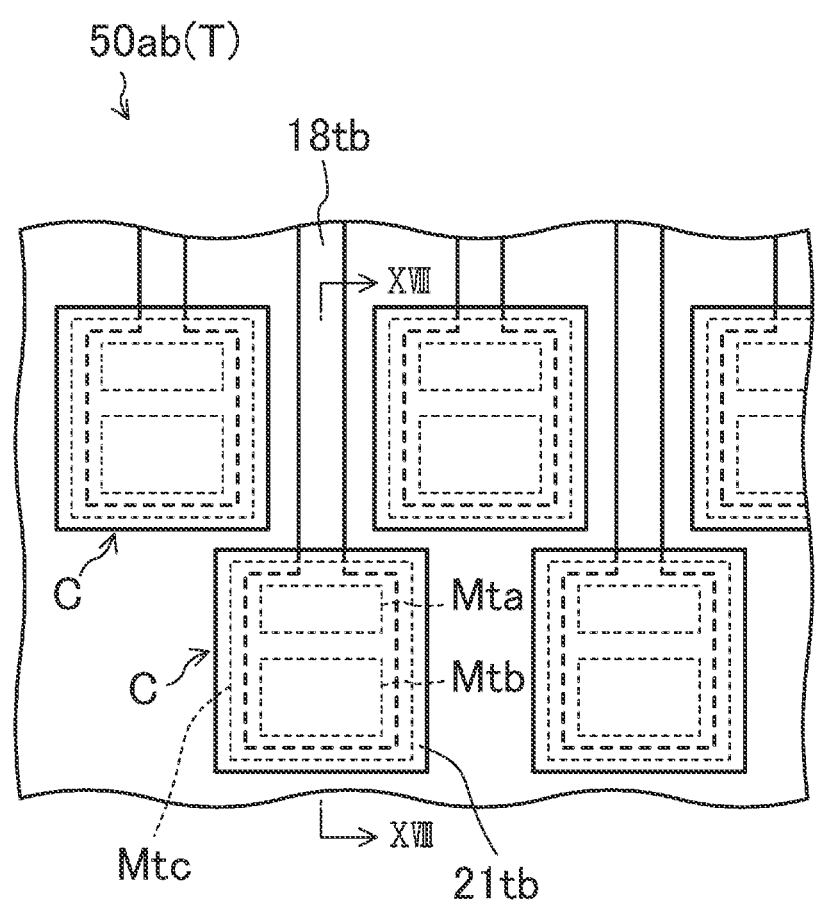
FIG. 17 is a plan view of a terminal portion of a frame area of Variation Example 6 of the OLED display device in accordance with the first embodiment of the disclosure.
Figure 18:
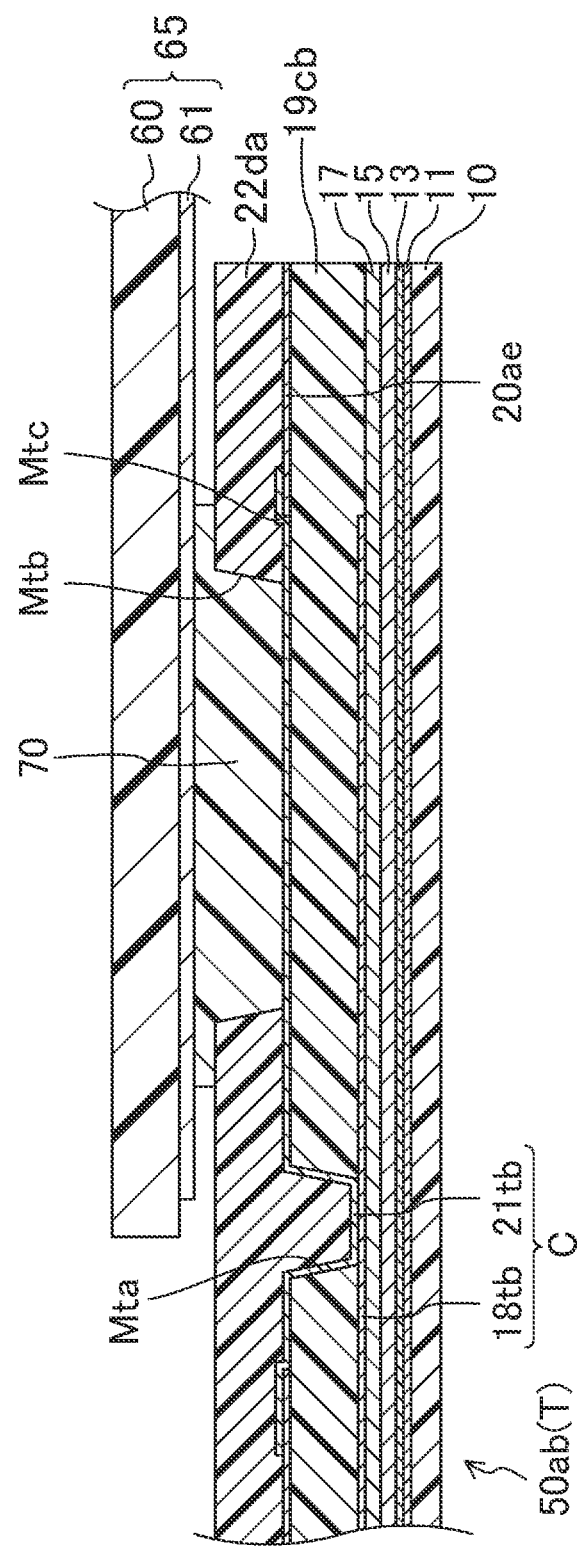
FIG. 18 is a cross-sectional view of the terminal portion of the frame area of Variation Example 6 of the OLED display device taken along line XVIII-XVIII shown in FIG. 17.

The present embodiment describes the OLED display device 50*a* as an example where the periphery of the third terminal opening Mtc lies outside the periphery of the first terminal opening Mta and the periphery of the second terminal opening Mtb in the terminal portion T. The present embodiment may be instead directed to either an OLED display device 50*aa* (Variation Example 5) or 50*ab* (Variation Example 6) detailed below. FIG. 15 is a plan view of the terminal portion T of the OLED display device 50*aa*, which is Variation Example 5 of the OLED display device 50*a*. FIG. 16 is a cross-sectional view of the terminal portion T of the OLED display device 50*aa* taken along line XVI-XVI shown in FIG. 15. FIG. 17 is a plan view of the terminal portion T of the OLED display device 50*ab*, which is Variation Example 6 of the OLED display device 50*a*. FIG. 18 is a cross-sectional view of the terminal portion T of the OLED display device 50*ab* taken along line XVIII-XVIII shown in FIG. 17.

Variation Example 5

The terminal C includes a first terminal electrode 18*ta* and a second terminal electrode 21*ta* on an edge T of the OLED display device 50*aa* as shown in FIGS. 15 and 16. The first terminal electrode 18*ta* corresponds to the first terminal electrode 18*t*. The second terminal electrode 21*ta* corresponds to the second terminal electrode 21*t*.

A first planarization film 19*ca* on the first terminal electrode 18*ta* has a first terminal opening Mta to expose a contact portion of the first terminal electrode 18*ta* as shown in FIGS. 15 and 16. The first planarization film 19*ca* is made of the same material and in the same layer as the first planarization film 19*a* in the display area D.

A second planarization film 22*da* on the second terminal electrode 21*ta* has a second terminal opening Mtb to expose a contact portion of the first terminal electrode 21*ta* as shown in FIGS. 15 and 16. The second planarization film 22*da* is made of the same material and in the same layer as the second planarization film 22*a* in the display area D. The second terminal opening Mtb is located outside the first terminal opening Mta as shown in FIGS. 15 and 16, so that the second terminal opening Mtb does not overlap the first terminal opening Mta in a plan view.

A fourth interlayer insulation film 20*ae* between the first planarization film 19*ca* and the second planarization film 22*da* has a third terminal opening Mtc in such a manner that the third terminal opening Mtc contains the first terminal opening Mta and the second terminal opening Mtb in a plan view as shown in FIGS. 15 and 16.

The second terminal electrode 21*ta* is in contact with the first terminal electrode 18*ta* via the first terminal opening Mta and electrically connected to the opposite electrode 61 of the FPC 65 via the ACF 70, as shown in FIG. 16. The second terminal electrode 21*ta* is provided in such a manner as to contain the third terminal opening Mtc and the periphery thereof in a plan view as shown in FIG. 15.

The OLED display device 50*aa*, structured as above, can reduce the thickness of the ACF 70 when compared to the OLED display device 50*a*, thereby restraining improper contacts and hence improving the yield of the packaging step.

Variation Example 6

The terminal C includes a first terminal electrode 18*tb* and a second terminal electrode 21*tb* on an edge T of the OLED display device 50*ab* as shown in FIGS. 17 and 18. The first terminal electrode 18*tb* corresponds to the first terminal electrode 18*t*. The second terminal electrode 21*tb* corresponds to the second terminal electrode 21*t*.

A first planarization film 19*cb* on the first terminal electrode 18*tb* has a first terminal opening Mta to expose a contact portion of the first terminal electrode 18*ta* as shown in FIGS. 17 and 18. The first planarization film 19*cb* is made of the same material and in the same layer as the first planarization film 19*a* in the display area D.

A second planarization film 22*da* on the second terminal electrode 21*ta* has a second terminal opening Mtb to expose a contact portion of the first terminal electrode 21*ta* as shown in FIGS. 17 and 18. The second terminal opening Mtb is located outside the first terminal opening Mta as shown in FIGS. 17 and 18, so that the second terminal opening Mtb does not overlap the first terminal opening Mta in a plan view. The first terminal electrode 18*tb* has substantially the same structure as the first terminal electrode 18*t* and is provided overlapping the second terminal opening Mtb in a plan view as shown in FIGS. 17 and 18.

A fourth interlayer insulation film 20*ae* between the first planarization film 19*ca* and the second planarization film 22*da* has a third terminal opening Mtc in such a manner that the third terminal opening Mtc contains the first terminal opening Mta and the second terminal opening Mtb in a plan view as shown in FIGS. 17 and 18.

The second terminal electrode 21*tb* is in contact with the first terminal electrode 18*tb* via the first terminal opening Mta and electrically connected to the opposite electrode 61 of the FPC 65 via the ACF 70, as shown in FIG. 18. The second terminal electrode 21*tb* is provided in such a manner as to contain the third terminal opening Mtc and the periphery thereof in a plan view as shown in FIG. 17.

The OLED display device 50*ab*, structured as above, can reduce the thickness of the ACF 70 when compared to the OLED display device 50*a*, thereby restraining improper contacts and hence improving the yield of the packaging step. In addition, each terminal C is a stack of the first terminal electrode 18*tb* in the relatively thick third wiring layer and the second terminal electrode 21*tb* in the relatively thick fourth wiring layer. The OLED display device 50*ab*, including such terminals C, is ensured to have sufficient stiffness even after the glass substrate is detached from the resin substrate layer 10, thereby improving the yield of the packaging step.

In the subpixel P of the OLED display device 50*a* described above, the first TFT 9*a* is turned on in response to a gate signal fed to the first TFT 9*a* via the gate line 14*d*. A prescribed voltage corresponding to a source signal is written to the gate electrode 14*b* of the second TFT 9*b* and the capacitor 9*d* via the source line 18*f* The third TFT 9*c* is turned on when the third TFT 9*c* is fed with a light-emission control signal via the light-emission control line 14*e*. The light-emitting layer 3 in the organic light-emitting layer 33 emits light in response to an electric current, fed to the organic light-emitting layer 33 via the power supply line 21a, that matches the gate voltage of the second TFT 9b. An image display is hence produced. In the OLED display device 50a, since the gate voltage of the second TFT 9b is maintained by the capacitor 9d when the first TFT 9a is turned off, the light-emitting layer 3 continuously emits light in the subpixel P until a gate signal is fed for a next frame.

Next will be described a method of manufacturing the OLED display device 50a in accordance with the present embodiment. The method of manufacturing the OLED display device 50a in accordance with the present embodiment includes a TFT layer forming step, an OLED layer forming step, a sealing film forming step, and a packaging step.

TFT Layer Forming Step

The TFT layer 30 is formed by forming, for example, the base coat film 11, the first TFTs 9a, the second TFTs 9b, the third TFTs 9c, the capacitors 9d, the first planarization film 19a, the fourth interlayer insulation film 20a, the power supply lines 21a, and the second planarization film 22a on the surface of the resin substrate layer 10 on a glass substrate by a well-known method.

OLED Layer Forming Step

The OLED layer 35 is formed by forming the first electrodes 31a, the edge cover 32a, the organic light-emitting layers 33 (the hole injection layer 1, the hole transport layer 2, the light-emitting layer 3, the electron transport layer 4, and the electron injection layer 5), and the second electrode 34 by a well-known method on the second planarization film 22a in the TFT layer 30 formed by the TFT layer forming step.

Sealing Film Forming Step

First, the first inorganic sealing film 36 is formed by forming inorganic insulation films such as a silicon nitride film, a silicon oxide film, and a silicon oxynitride film by plasma CVD using a mask on the surface of the substrate carrying the OLED layer 35 formed thereon in the OLED layer forming step.

Subsequently, the organic sealing film 37 is formed by forming a film of an organic resin material such as an acrylic resin by, for example, inkjet technology on the surface of the substrate carrying a first inorganic film 36 formed thereon.

Thereafter, the second inorganic sealing film 38 is formed by forming inorganic insulation films such as a silicon nitride film, a silicon oxide film, and a silicon oxynitride film by plasma CVD using a mask on the substrate carrying an organic film 37 formed thereon, which forms the sealing film 40.

Then, after a protection sheet (not shown) is attached to the surface of the substrate now carrying the sealing film 40 formed thereon, a laser beam is projected onto the glass substrate on the resin substrate layer 10 to detach the glass substrate from the bottom face of the resin substrate layer 10. A protection sheet (not shown) is then attached to the bottom face of the resin substrate layer 10 from which the glass substrate has been detached.

Packaging Step

First, the protection sheet attached to the surface of the sealing film 40 in the sealing film forming step is partially removed by, for example, projecting a laser beam onto the protection sheet, which exposes the terminals C in the terminal portion T.

The ACF 70 is then tentatively fixed to the terminals C in the terminal portion T.

After the terminals C in the terminal portion T and the opposite electrode 61 of the FPC 65 are aligned so as to overlap via the ACF 70, the FPC 65 is pressed using a pressure bonding tool to mount the FPC 65 to the terminal portion T.

The OLED display device 50a in accordance with the present embodiment is hence manufactured.

As described so far, in the OLED display device 50a in accordance with the present embodiment, the fourth interlayer insulation film 20a, provided between the first planarization film 19a and the power supply line 21a, covers the first frame line 18h and an edge, of the second frame line 18i, that is exposed in the first slit Sa and the second slit Sb in a region where the first frame line 18h is located opposite the second frame line 18i in a plan view. Therefore, even if the metal film that will form the first electrode 31a remains between the first frame line 18h and the second frame line 18i on the bottom portion of the sidewall of the first slit Sa and the second slit Sb, the first frame line 18h and the second frame line 18i are covered by the fourth interlayer insulation film 20a in the region where the first frame line 18h is located opposite the second frame line 18i in a plan view. This structure restrains short-circuiting between the first frame line 18h and the second frame line 18i.

In addition, in the OLED display device 50a in accordance with the present embodiment, each terminal C in the terminal portion T is a stack of the first terminal electrode 18t in the relatively thick third wiring layer and the second terminal electrode 21t in the relatively thick fourth wiring layer. The OLED display device 50a, including such terminals C, is ensured to have sufficient stiffness even after the glass substrate is detached from the resin substrate layer 10, thereby improving the yield of the packaging step.

Second Embodiment

Figure 19:
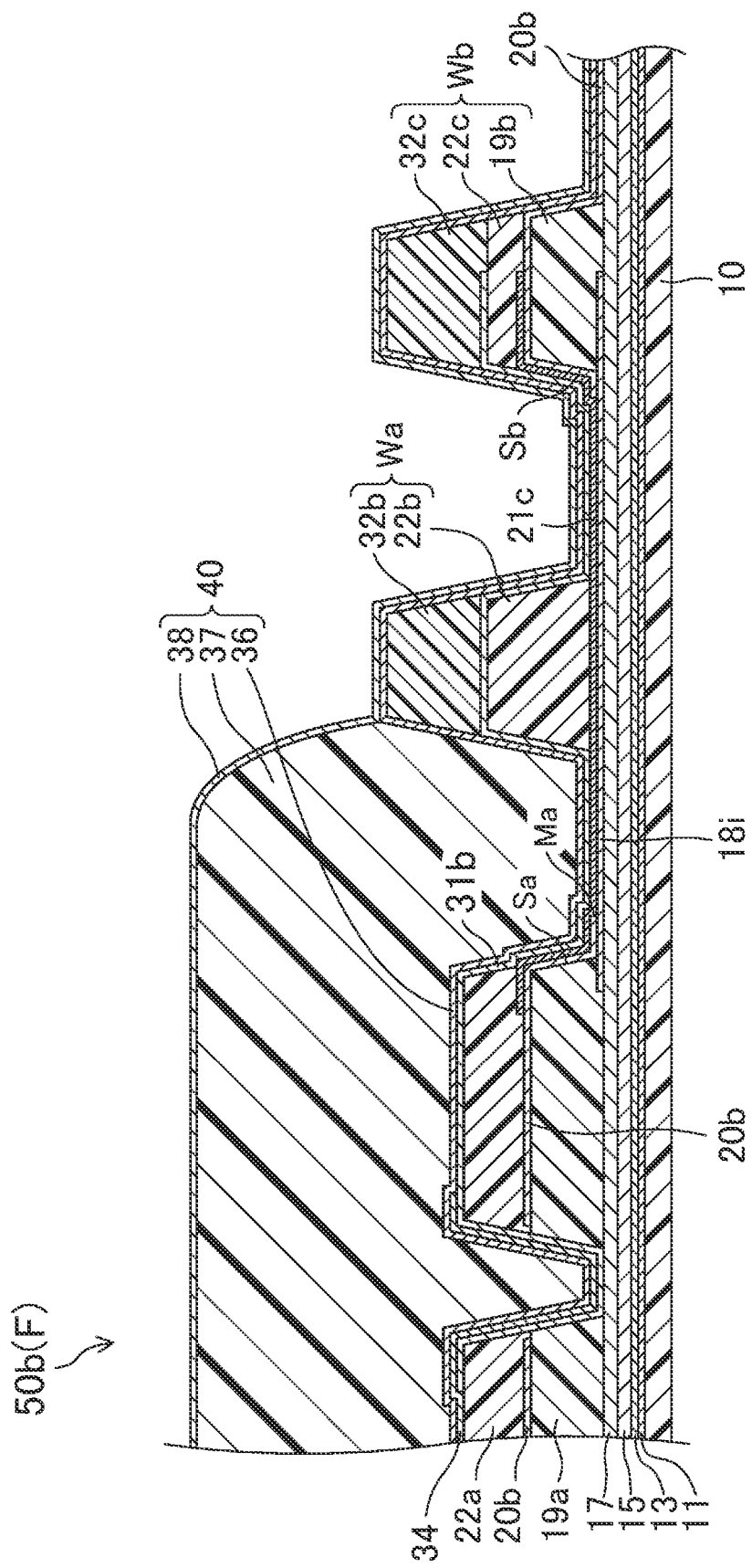
FIG. 19, corresponding to FIG. 6, is a cross-sectional view of a frame area of an OLED display device in accordance with a second embodiment of the disclosure.
Figure 20:
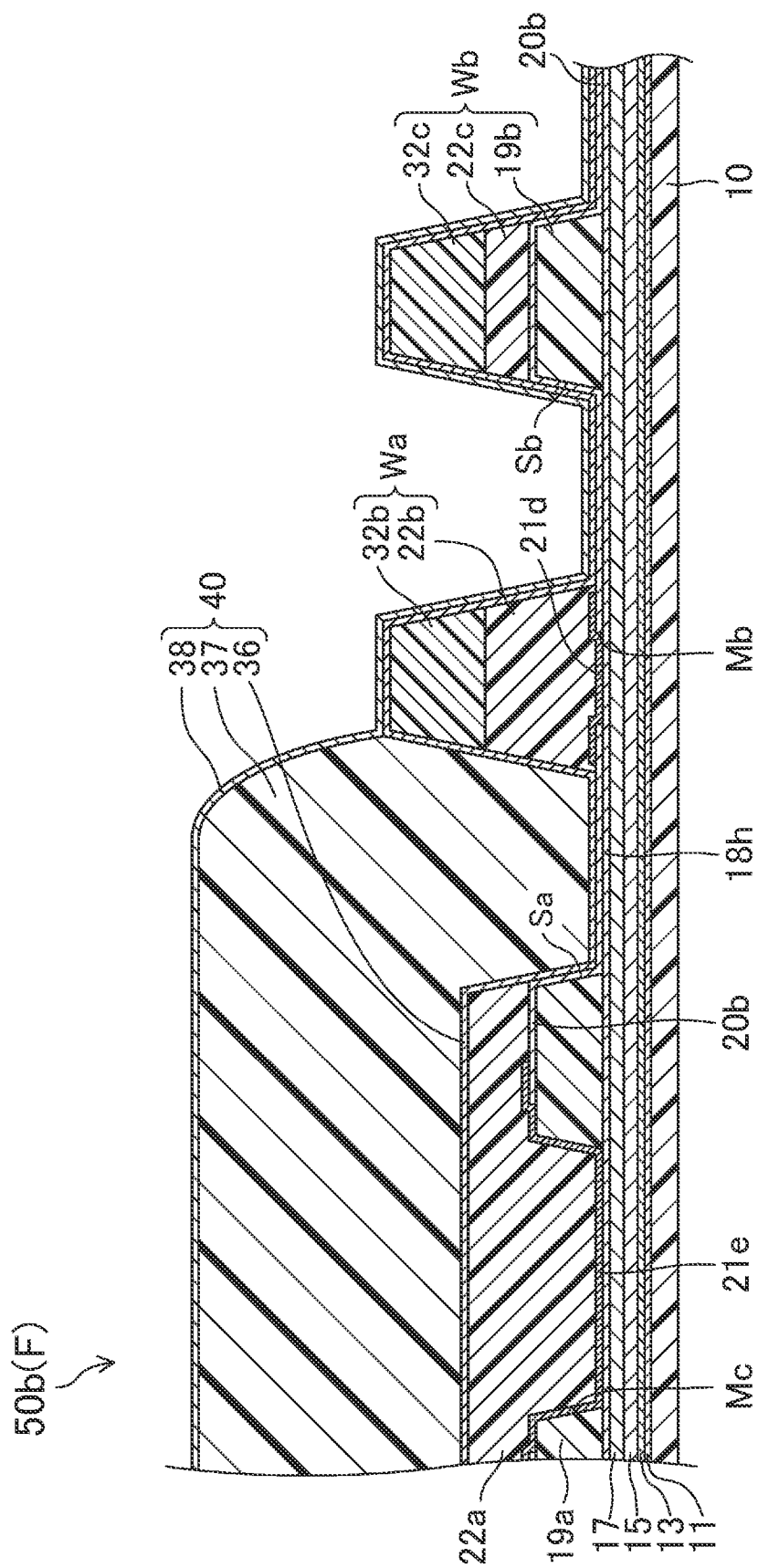
FIG. 20, corresponding to FIG. 7, is a cross-sectional view of the frame area of the OLED display device in accordance with the second embodiment of the disclosur.
Figure 21:
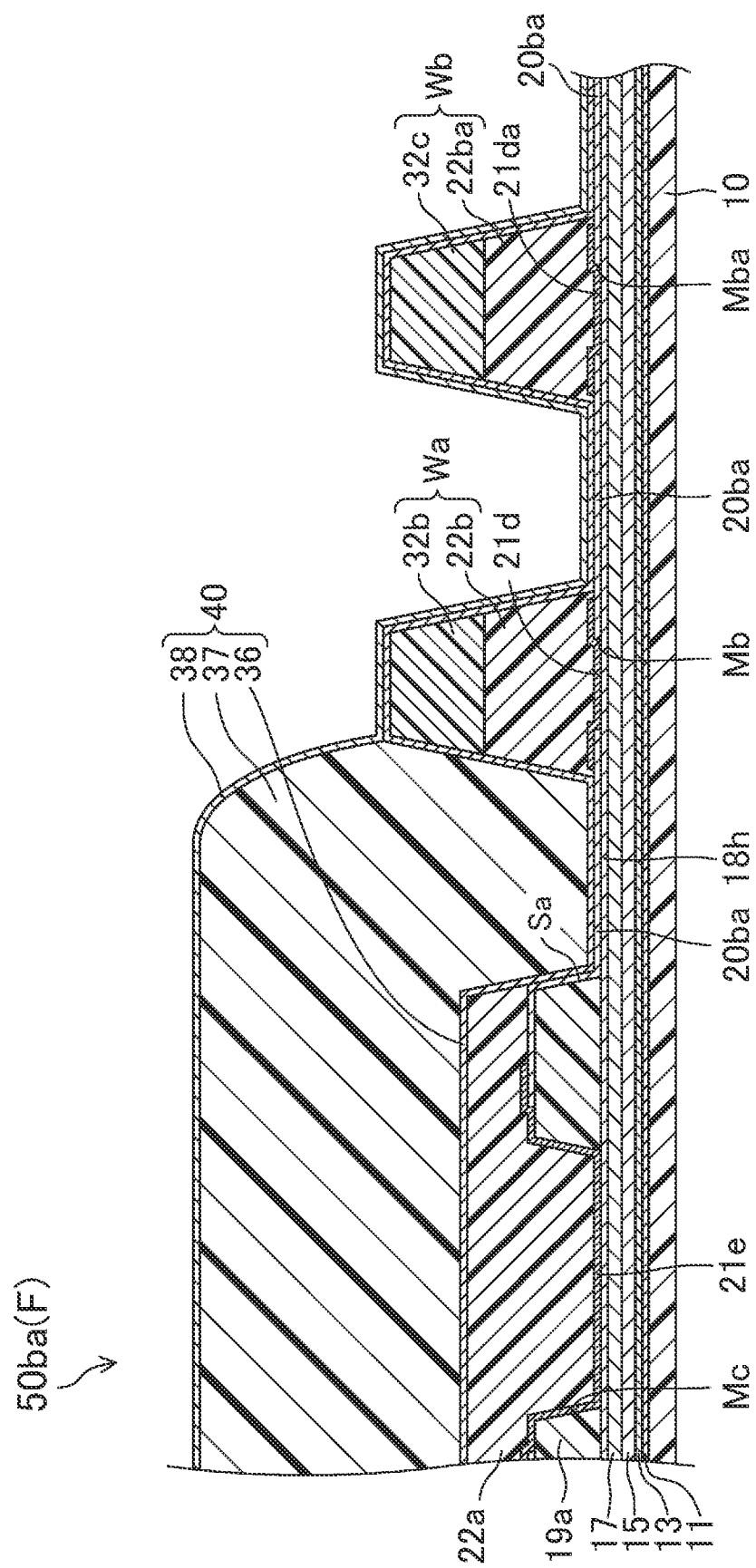
FIG. 21, corresponding to FIG. 20, is a cross-sectional view of a frame area of a variation example of the OLED display device in accordance with the second embodiment of the disclosure.

FIGS. 19 to 21 illustrate a second embodiment of the display device in accordance with the disclosure. FIGS. 19 and 20, corresponding respectively to FIGS. 6 and 7 to which reference is made in the first embodiment above, are cross-sectional views of a frame area F of an OLED display device 50b in accordance with the present embodiment. FIG. 21, corresponding to FIG. 20, is a cross-sectional view of a frame area F of an OLED display device 50ba that is a variation example of the OLED display device 50b. Members of this and subsequent embodiments that are the same as those shown in FIGS. 1 to 18 are indicated by the same reference signs or numerals, and detailed description thereof is omitted.

The first embodiment above describes as an example the OLED display device 50a in which there is no other metal film stacked on the first frame line 18h and the second frame line 18i. The present embodiment describes as an example the OLED display device 50b in which there is another metal film stacked on the first frame line 18h and the second frame line 18i.

The OLED display device 50b has a rectangular display area D and the frame area F shaped like a frame that surrounds the display area D, similarly to the OLED display device 50a in accordance with the first embodiment above.

The OLED display device 50b includes: a resin substrate layer 10; a TFT layer 30 on the resin substrate layer 10; an OLED layer 35 as a light-emitting element on the TFT layer 30; and a sealing film 40 covering the OLED layer 35, similarly to the OLED display device 50a in accordance with the first embodiment above.

The OLED display device 50b includes a first damming wall Wa and a second damming wall Wb in the frame area F, similarly to the OLED display device 50a in accordance with the first embodiment above. The first damming wall Wa is provided like a frame outside the trench G. The second damming wall Wb is provided like a frame around the first damming wall Wa.

The OLED display device 50b includes, in the frame area F: a first frame line 18h primarily provided in an opening part of the trench G; and a second frame line 18i provided generally like letter C outside the trench similarly to the OLED display device 50a in accordance with the first embodiment above.

On the second frame line 18i is there provided a second conductive layer 21c made of the same material and in the same layer as the power supply lines 21a as shown in FIG. 19. The second conductive layer 21c serves as the fourth wiring layer described above in the first slit Sa and the second slit Sb as shown in FIG. 19. The second conductive layer 21c is in contact with the first conductive layer 31b and the second frame line 18i as shown in FIG. 19. The fourth interlayer insulation film 20b, corresponding to the fourth interlayer insulation film 20a in accordance with the first embodiment above, is provided covering an edge, of the second frame line 18i, that faces the display area D and that is exposed in the first slit Sa and also covering an edge, of the second frame line 18i, that is opposite the display area D and that is exposed in the second slit Sb, as shown in FIG. 19. As shown in FIG. 19, the fourth interlayer insulation film 20b has a first opening Ma to expose the second frame line 18i, and the second conductive layer 21c is provided covering the entire second frame line 18h exposed in the first opening Ma.

On the first frame line 18h are there provided a third conductive layer 21d and a fourth conductive layer 21e made of the same material and in the same layer as the power supply lines 21a as shown in FIG. 20. The third conductive layer 21d is provided as the fourth wiring layer so as to overlap the first damming wall Wa as shown in FIG. 16. The fourth interlayer insulation film 20b is provided covering the entire first frame line 18h exposed in the first slit Sa and the second slit Sb as shown in FIG. 20. The fourth interlayer insulation film 20b has a second opening Mb overlapping the first damming wall Wa to expose the first frame line 18h as shown in FIG. 20. The third conductive layer 21d is provided covering the entire first frame line 18h exposed in the second opening Mb as shown in FIG. 20, to come into contact with the first frame line 18h. The first planarization film 19a has a third opening Mc between the first slit Sa and the display area D to expose the first frame line 18h. The fourth conductive layer 21e is provided as the fourth wiring layer in the third opening Mc as shown in FIG. 20. The fourth conductive layer 21e is provided covering the entire first frame line 18h exposed in the third opening Mc as shown in FIG. 20.

Similarly to the OLED display device 50a in accordance with the first embodiment above, the OLED display device 50b is flexible and structured so as to produce an image display by the light-emitting layer 3 emitting light in the organic light-emitting layer 33 in a suitable manner via the first TFT 9a, the second TFT 9b, and the third TFT 9c in the subpixel P.

The present embodiment describes as an example the OLED display device 50b in which the third conductive layer 21d is provided overlapping the first damming wall Wa. The OLED display device 50ba is an alternative example where besides the third conductive layer 21d, there is provided a third conductive layer 21da overlapping the second damming wall Wb as shown in FIG. 21. In the OLED display device 50ba, the first damming wall Wa and the second damming wall Wb have the same cross-sectional structure, and the second damming wall Wb includes: a lower resin layer 22ba made of the same material and in the same layer as the second planarization film 22a; and an upper resin layer 32c made of the same material and in the same layer as the edge cover 32a. A fourth interlayer insulation film 20ba, corresponding to the fourth interlayer insulation film 20b, has a second opening Mba overlapping the second damming wall Wb to expose the first frame line 18h as shown in FIG. 21.

The OLED display device 50b in accordance with the present embodiment can be manufactured by forming the second conductive layer 21c and the third conductive layer 21d in forming the power supply lines 21a by the aforementioned method of manufacturing the OLED display device 50a in accordance with the first embodiment.

As described so far, in the OLED display device 50b in accordance with the present embodiment, the fourth interlayer insulation film 20b, provided between the first planarization film 19a and the power supply line 21a, covers the first frame line 18h exposed in the first slit Sa and the second slit Sb in a region where the first frame line 18h is located opposite the second frame line 18i in a plan view. Therefore, even if the metal film that will form the first electrode 31a remains between the first frame line 18h and the second frame line 18i on the bottom portion of the sidewall of the first slit Sa and the second slit Sb, the first frame line 18h and the second frame line 18i are covered by the fourth interlayer insulation film 20b in the region where the first frame line 18h is located opposite the second frame line 18i in a plan view. This strontium restrains short-circuiting between the first frame line 18h and the second frame line 18i.

In addition, in the OLED display device 50b in accordance with the present embodiment, the third conductive layer 21d and the fourth conductive layer 21e are stacked on the first frame line 18h, and the second conductive layer 21c is stacked on the second frame line 18i. This structure reduces the wiring resistance of the first frame line 18h and the second frame line 18i.

Other Embodiments

Each embodiment above describes as an example an organic light-emitting layer including five layers: a hole injection layer, a hole transport layer, a light-emitting layer, an electron transport layer, and an electron injection layer. The organic light-emitting layer may alternatively include, for example, three layers: a hole injection and transport layer, a light-emitting layer, and an electron transport and injection layer.

Each embodiment above describes as an example an OLED display device in which the first electrode is an anode, and the second electrode is a cathode. The disclosure is equally applicable to an OLED display device in which the layered structure of the organic light-emitting layer is reversed, so that the first electrode is a cathode and the second electrode is an anode.

Each embodiment above describes as an example an OLED display device in which the electrode of the TFT that is connected to the first electrode is a drain electrode. The disclosure is equally applicable to an OLED display device in which the electrode of the TFT that is connected to the first electrode is referred to as the source electrode.

The embodiments have so far discussed the OLED display device as an exemplary display device. The disclosure is also applicable to any display device including a plurality of current-driven light-emitting elements, for instance, display devices including QLEDs (quantum-dot light-emitting diodes) which are light-emitting elements including a quantum-dot layer.

INDUSTRIAL APPLICABILITY

As described so far, the disclosure is useful in flexible display devices.

The invention claimed is:

1. A display device comprising:
   a base substrate;
   a thin film transistor layer on the base substrate, the thin film transistor layer including a sequential stack of a semiconductor layer, a first interlayer insulation film, a first wiring layer, a second interlayer insulation film, a second wiring layer, a third interlayer insulation film, a third wiring layer, a first planarization film, a fourth wiring layer, and a second planarization film;
   a light-emitting element layer on the thin film transistor layer, the light-emitting element layer including a sequential stack of a plurality of first electrodes, a common edge cover, a plurality of light-emitting layers, and a common second electrode in such a manner as to correspond to a plurality of subpixels in a display area;
   a sealing film covering the light-emitting element layer and including a sequential stack of a first inorganic sealing film, an organic sealing film, and a second inorganic sealing film;
   a first damming wall in a frame area surrounding the display area, the first damming wall surrounding the display area, overlapping a periphery of the organic sealing film, and being separated from the first planarization film and the second planarization film in the display area by a first slit formed through the first planarization film and the second planarization film;
   a second damming wall in the frame area, the second damming wall surrounding the first damming wall and being separated from the first damming wall by a second slit formed through the first planarization film and the second planarization film;
   a power supply line as the fourth wiring layer in the display area, the power supply line being electrically connected to the plurality of first electrodes via a thin film transistor;
   a first frame line as the third wiring layer in the frame area, the first frame line being electrically connected to the power supply line;
   a second frame line as the third wiring layer in the frame area, the second frame line being electrically connected to the second electrode; and
   a first conductive layer in the frame area, the first conductive layer being made of a same material and in a same layer as the plurality of first electrodes, overlapping the second frame line via the first slit, and electrically connecting the second frame line and the second electrode, wherein
   there is provided a fourth interlayer insulation film between the third wiring layer and the fourth wiring layer, and
   the fourth interlayer insulation film covers an edge of either one or both of the first frame line and the second frame line in a region where the first frame line is located opposite the second frame line in a plan view, the edge facing the display area and being exposed in the first slit.

2. The display device according to claim 1, wherein the fourth interlayer insulation film covers the entire first frame line exposed in the first slit.

3. The display device according to claim 1, wherein the fourth interlayer insulation film covers the entire first frame line exposed in the second slit.

4. The display device according to claim 1, wherein the fourth interlayer insulation film covers the edge of the second frame line, the edge facing the display area and being exposed in the first slit.

5. The display device according to claim 1, wherein the fourth interlayer insulation film covers an edge of the second frame line, the edge being opposite the display area and exposed in the second slit.

6. The display device according to claim 1, wherein the fourth interlayer insulation film resides on the first planarization film.

7. The display device according to claim 1, wherein the first conductive layer is in contact with the second frame line in the first slit.

8. The display device according to claim 1, wherein
   there is provided a second conductive layer as the fourth wiring layer in the first slit, and
   the second conductive layer is in contact with the first conductive layer and the second frame line.

9. The display device according to claim 8, wherein the fourth interlayer insulation film covers the edge of the second frame line, the edge facing the display area and being exposed in the first slit, and covers an edge of the second frame line, the edge being opposite the display area and exposed in the second slit.

10. The display device according to claim 9, wherein
    the fourth interlayer insulation film has a first opening to expose the second frame line, and
    the second conductive layer covers the entire second frame line exposed in the first opening.

11. The display device according to claim 1, wherein
    there is provided a third conductive layer as the fourth wiring layer, the third conductive layer overlapping the first damming wall, and
    the third conductive layer is in contact with the first frame line.

12. The display device according to claim 11, wherein the fourth interlayer insulation film covers the entire first frame line exposed in the first slit and the second slit.

13. The display device according to claim 11, wherein
    the fourth interlayer insulation film has a second opening overlapping the first damming wall to expose the first frame line, and
    the third conductive layer covers the entire first frame line exposed in the second opening.

14. The display device according to claim 1, wherein
    the first planarization film has a third opening between the first slit and the display area to expose the first frame line,
    there is provided a fourth conductive layer as the fourth wiring layer in the third opening, and
    the fourth conductive layer covers the entire first frame line exposed in the third opening.

15. The display device according to claim 1, wherein
    there is provided a terminal portion on an edge of the frame area, the terminal portion including a plurality of terminals,
    each of the plurality of terminals includes a first terminal electrode as the third wiring layer and a second terminal electrode as the fourth wiring layer, the first planarization film has a first terminal opening to expose the first terminal electrode, the second terminal electrode is in contact with the first terminal electrode via the first terminal opening, and the second planarization film has a second terminal opening to expose the second terminal electrode.

16. The display device according to claim 15, wherein the second terminal electrode is electrically connected to an opposite electrode on a flexible printed board via the second terminal opening.

17. The display device according to claim 16, wherein the fourth interlayer insulation film has a third terminal opening overlapping the second terminal electrode, and the third terminal opening has a periphery thereof outside a periphery of the first terminal opening and a periphery of the second terminal opening.

18. The display device according to claim 16, wherein the second terminal opening is located outside the first terminal opening in a plan view.

19. The display device according to claim 18, wherein the first terminal electrode overlaps the second terminal opening in a plan view.

20. The display device according to claim 1, wherein each of the plurality of light-emitting layers is an organic light-emitting layer.

* * * * *